(12) United States Patent
Duriez et al.

(10) Patent No.: US 11,018,243 B2
(45) Date of Patent: May 25, 2021

(54) SEMICONDUCTOR DEVICE AND MANUFACTURING METHOD THEREOF

(71) Applicant: TAIWAN SEMICONDUCTOR MANUFACTURING CO., LTD., Hsinchu (TW)

(72) Inventors: Blandine Duriez, Brussels (BE); Martin Christopher Holland, Bertem (BE); Georgios Vellianitis, Heverlee (BE); Mark Van Dal, Linden (BE)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 15/627,568

(22) Filed: Jun. 20, 2017

(65) Prior Publication Data

US 2018/0315833 A1    Nov. 1, 2018

Related U.S. Application Data

(60) Provisional application No. 62/490,620, filed on Apr. 27, 2017.

(51) Int. Cl.
| | |
|---|---|
| *H01L 29/775* | (2006.01) |
| *H01L 29/80* | (2006.01) |
| *H01L 29/66* | (2006.01) |
| *H01L 29/06* | (2006.01) |
| *H01L 29/423* | (2006.01) |
| *H01L 29/786* | (2006.01) |
| *B82Y 10/00* | (2011.01) |
| *H01L 29/417* | (2006.01) |
| *H01L 29/08* | (2006.01) |

(52) U.S. Cl.
CPC ........ *H01L 29/66553* (2013.01); *B82Y 10/00* (2013.01); *H01L 29/0673* (2013.01); *H01L 29/0843* (2013.01); *H01L 29/41725* (2013.01); *H01L 29/42392* (2013.01); *H01L 29/66439* (2013.01); *H01L 29/66545* (2013.01); *H01L 29/66742* (2013.01); *H01L 29/66772* (2013.01); *H01L 29/775* (2013.01); *H01L 29/78654* (2013.01); *H01L 29/78696* (2013.01)

(58) Field of Classification Search
None
See application file for complete search history.

(56) References Cited

U.S. PATENT DOCUMENTS

| | | | |
|---|---|---|---|
| 9,379,025 B1* | 6/2016 | Basker | ............ H01L 21/823821 |
| 2012/0319178 A1* | 12/2012 | Chang | .................... B82Y 10/00 |
| | | | 257/287 |
| 2013/0234215 A1* | 9/2013 | Okano | .............. H01L 29/42392 |
| | | | 257/255 |

(Continued)

*Primary Examiner* — Joseph C. Nicely
*Assistant Examiner* — Lamont B Koo
(74) *Attorney, Agent, or Firm* — Birch, Stewart, Kolasch & Birch LLP

(57) ABSTRACT

A semiconductor device includes a substrate, a gate structure, a plurality of nanowires, a sacrificial material, and an epitaxy structure. The gate structure is disposed on and in contact with the substrate. The nanowires extend through the gate structure. The sacrificial material is separated from the gate structure. The epitaxy structure is in contact with the nanowires, is separated from the substrate, and surrounds the sacrificial material.

20 Claims, 50 Drawing Sheets

(56) References Cited

U.S. PATENT DOCUMENTS

| | | | |
|---|---|---|---|
| 2014/0034908 A1* | 2/2014 | Bangsaruntip | H01L 29/775 257/27 |
| 2015/0162403 A1* | 6/2015 | Oxland | H01L 29/0673 257/27 |
| 2016/0099338 A1* | 4/2016 | Chang | H01L 21/3065 257/347 |
| 2016/0329429 A1* | 11/2016 | Cheng | H01L 29/7851 |
| 2017/0018464 A1* | 1/2017 | Kim | H01L 21/823871 |
| 2017/0104062 A1* | 4/2017 | Bi | H01L 29/66545 |
| 2018/0053844 A1* | 2/2018 | Bi | H01L 29/7827 |

* cited by examiner

SEMICONDUCTOR DEVICE AND MANUFACTURING METHOD THEREOF

PRIORITY CLAIM AND CROSS-REFERENCE

This application claims priority to U.S. Provisional Application Ser. No. 62/490,620, filed Apr. 27, 2017, which is herein incorporated by reference.

BACKGROUND

Semiconductor nanowires are becoming a research focus in nanotechnology. Various methods of forming metal-oxide-semiconductor field-effect transistors (MOSFETs) comprising nanowires have been explored, including the use of dual material nanowire, where different material nanowires are used for N-channel field-effect transistor (NFET) and P-channel field-effect transistor (PFET) devices. For example, silicon (Si) nanowires may be used as the channel material for the NFET devices, while silicon germanium (SiGe) nanowires may be used as the channel material for the PFET devices. As another example, multiple-stacked ("multi-stack") nanowires have been used in forming NFET and PFET devices, increasing the current carrying capability of these devices. One of the multi-stack candidates is the FET. A trigate FET device consists of a vertical standing Si body (fin) and the gate is wrapped around either side creating two channels on the sides and one on the top. High-aspect-ratio trigate FETs with aggressively scaled fin widths (30 nm and narrower) are of particular interest as they combine excellent short channel effect (SCE) immunity with high drivability per unit chip area.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 1A-16A are top views of a local semiconductor device at various stages of fabrication in accordance with some embodiments of the present disclosure;

FIGS. 1B-16B are cross-sectional views along sections A-A in FIGS. 1A-16A respectively;

FIGS. 1C-16C are cross-sectional views along sections B-B in FIGS. 1A-16A respectively.

DETAILED DESCRIPTION

Figure 1A:
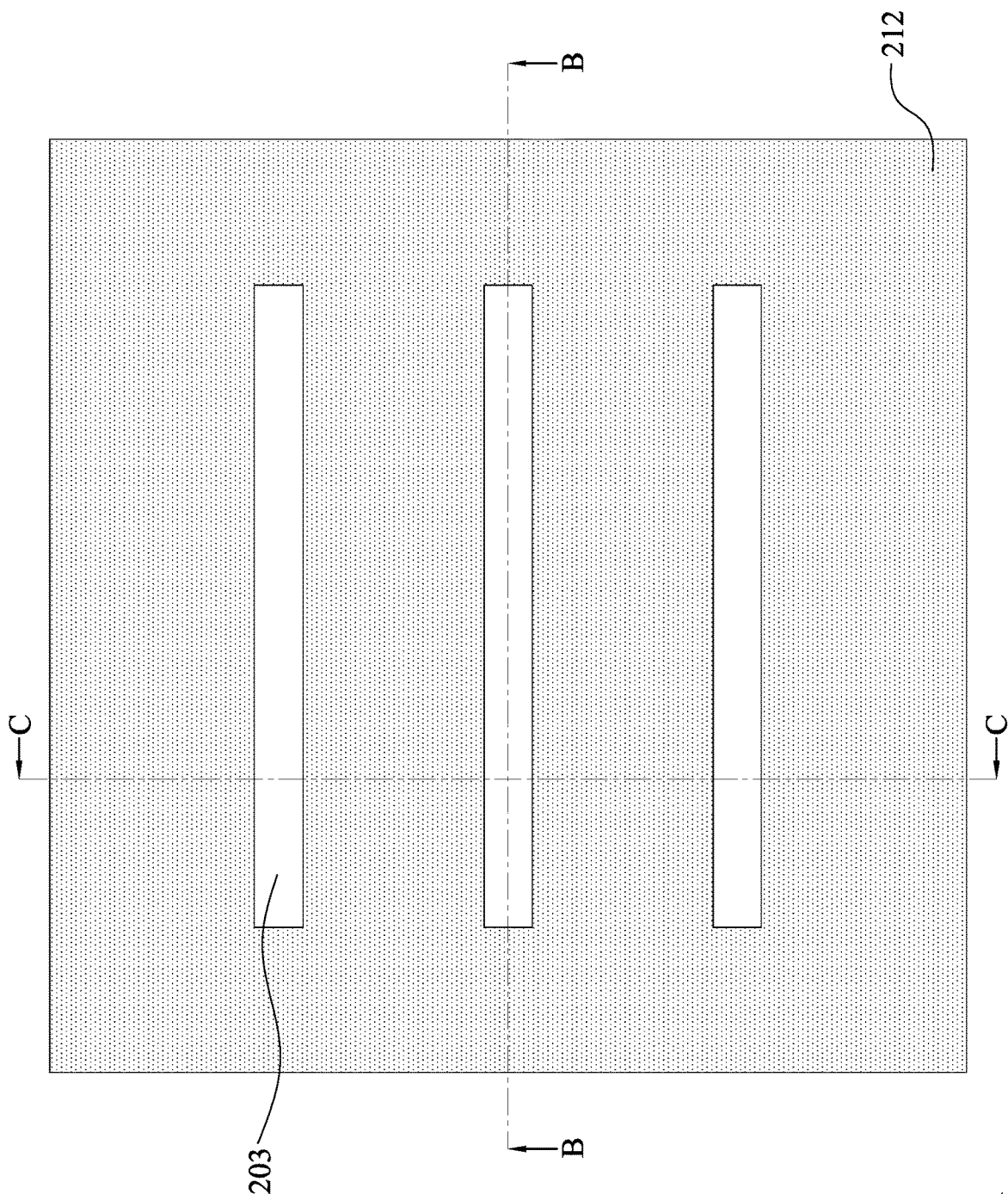

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

As used herein, the singular forms "a," "an" and "the" include plural referents unless the context clearly dictates otherwise. Therefore, reference to, for example, a gate stack includes aspects having two or more such gate stacks, unless the context clearly indicates otherwise. Reference throughout this specification to "one embodiment" or "an embodiment" means that a particular feature, structure, or characteristic described in connection with the embodiment is included in at least one embodiment of the present disclosure. Therefore, the appearances of the phrases "in one embodiment" or "in an embodiment" in various places throughout this specification are not necessarily all referring to the same embodiment. Further, the particular features, structures, or characteristics may be combined in any suitable manner in one or more embodiments. It should be appreciated that the following figures are not drawn to scale; rather, these figures are intended for illustration.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in some embodiments, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

A multi-stack structure, such as Ge/SiGe or Si/SiGe may be used to generate multi-stack nanowire devices. Such multi-stack nanowire devices may include one or more PFET devices and/or one or more NFET devices, where the PFET devices include Ge nanowire and the NFET devices comprise Si nanowire. However, it is difficult to reduce parasitic capacitance between source/drain and gate under such multi-stack nanowire devices. Illustrative embodiments described herein utilize a dual nanowire release scheme for gate and source and drain region.

Illustrative embodiments for forming a multi-stack nanowire FET device will be described below with reference to FIGS. 1A-16E. The structures illustrate operations which may be used in the process of forming a multi-stack nanowire FET device. FIGS. 1A-16A are top views of a local semiconductor device at various stages of fabrication in accordance with some embodiments of the present disclosure. FIGS. 1B-16B are cross-sectional views along sections A-A in FIGS. 1A-16A respectively. FIGS. 1C-16C are cross-sectional views along sections B-B in FIGS. 1A-16A respectively. FIGS. 16D and 16E are cross-sectional views along sections D-D and line E-E in FIG. 16A respectively.

Figure 1B:
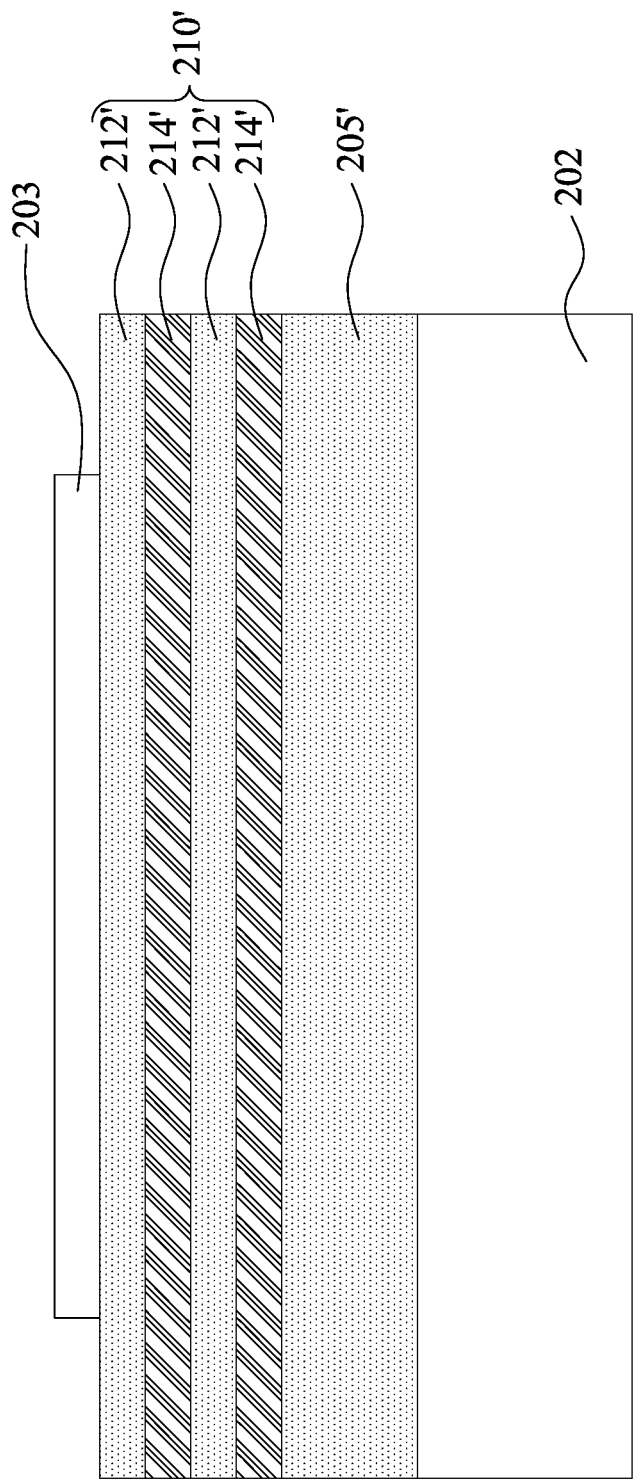
Figure 1C:
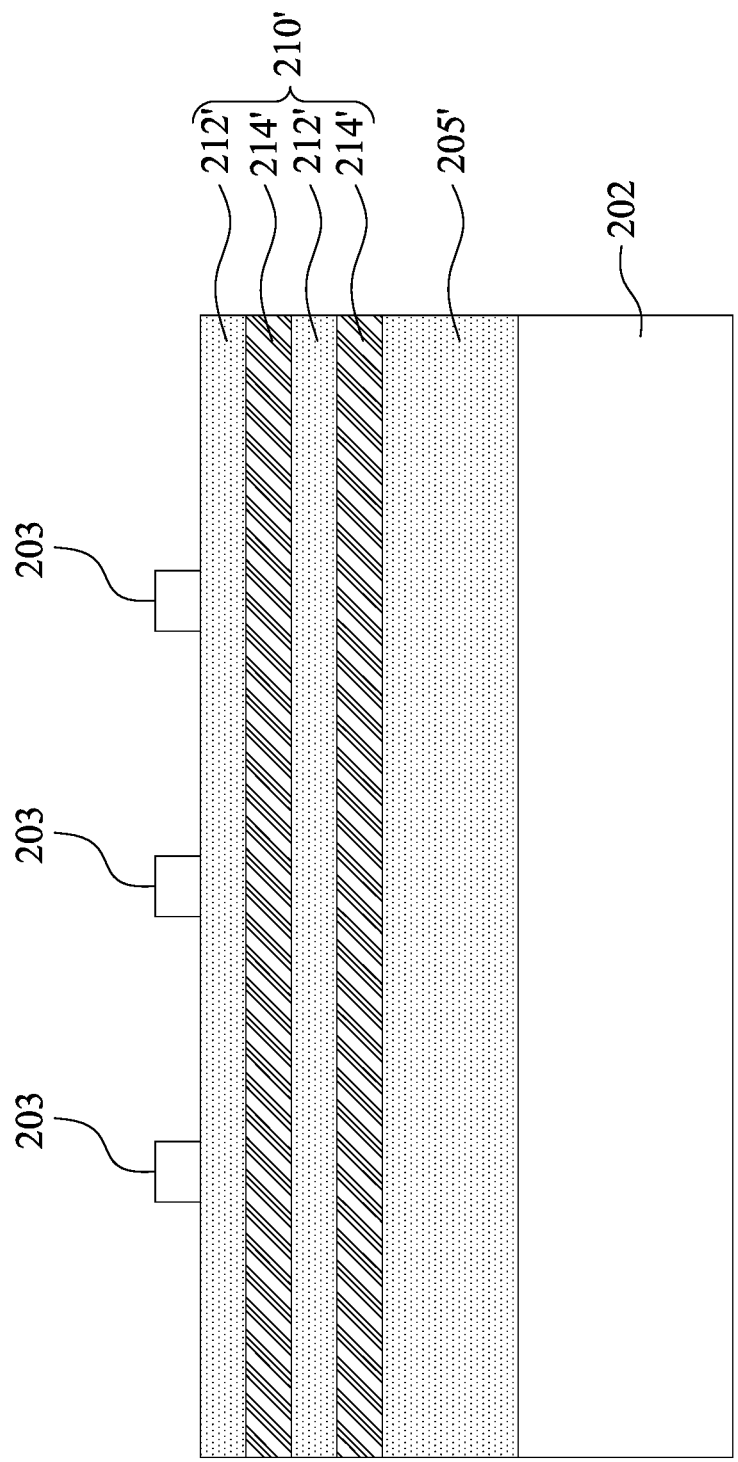

Reference is made to FIGS. 1A-1C. FIG. 1A is a top view of the structure 100. FIGS. 1B and 1C are cross-sectional views taken along sections B-B and C-C in FIG. 1A respectively. The structure 100 includes a semiconductor substrate 202, a bottom sacrificial layer 205', a multilayer stack 210', and a hard mask 203. The bottom sacrificial layer 205' is disposed on the semiconductor substrate 202, the multilayer stack 210' is disposed on the bottom sacrificial layer 205', and the hard mask 203 is disposed on the multilayer stack 210'. In some embodiments for NMOS, the semiconductor substrate 202 is made of a material, such as, Si, Ge, SiGe, In(Ga)As, or InSb. In some embodiments for PMOS, the semiconductor substrate 202 is made of a material, such as, Si, Ge, or (In)GaSb. The multilayer stack 210' includes sacrificial layers 212' and nanowire layers 214'. The sacrificial layers 212' and the nanowires 214' are stacked alternatively. For example, the nanowire layer 214' is interposed in between every two sacrificial layers 212'. In some embodiments, the sacrificial layers 212' may include SiGe or Si, and the nanowire layers 214' may include Si, SiGe, Ge, GaAs, InAs, InSb, and GaSb, and the instant disclosure is not limited thereto. The nanowire layers 214' may use the same material as the semiconductor substrate 202. The number of layers (sacrificial layer 212' and nanowire layer 214') in the multilayer stack 210' determines the number of nanowires in a fin after patterning. FIGS. 1A-1C show a multilayer stack 210' having two sacrificial layers 212' and two nanowire layers 214'. In this case, two nanowires are formed later, and the instant disclosure is not limited thereto. The thickness of the sacrificial layers 212' also determines the pitch between the nanowires, and the thickness of the nanowire layers 214' determines the dimension of the nanowires. The hard mask 203 is formed over a portion of the topmost sacrificial layer 212', and may be selectively removed in the areas in which a FET stacked nanowire device is to be formed. Although the resulting hard mask 203 shown in FIGS. 1A-1C is patterned into three strips with equal spacing, embodiments are not so limited. The resulting hard mask 203 may be in four, five, six or more strips, and the spacing between the strips may be varied in other embodiments. The hard mask 203 may be an oxide or nitride, for example, $SiO_2$ and $Si_3N_4$, and the instant disclosure is not limited thereto.

Figure 2A:
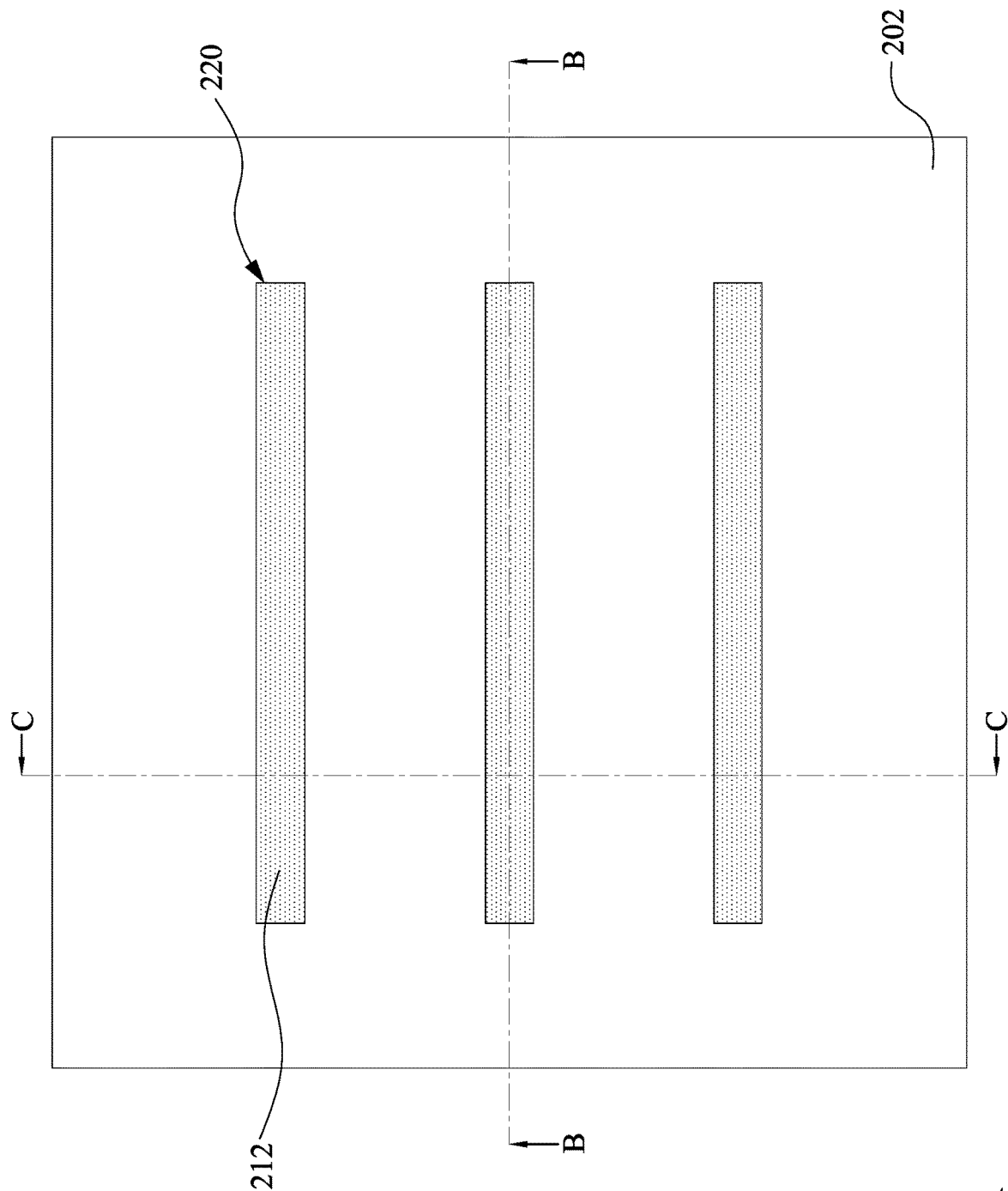
Figure 2B:
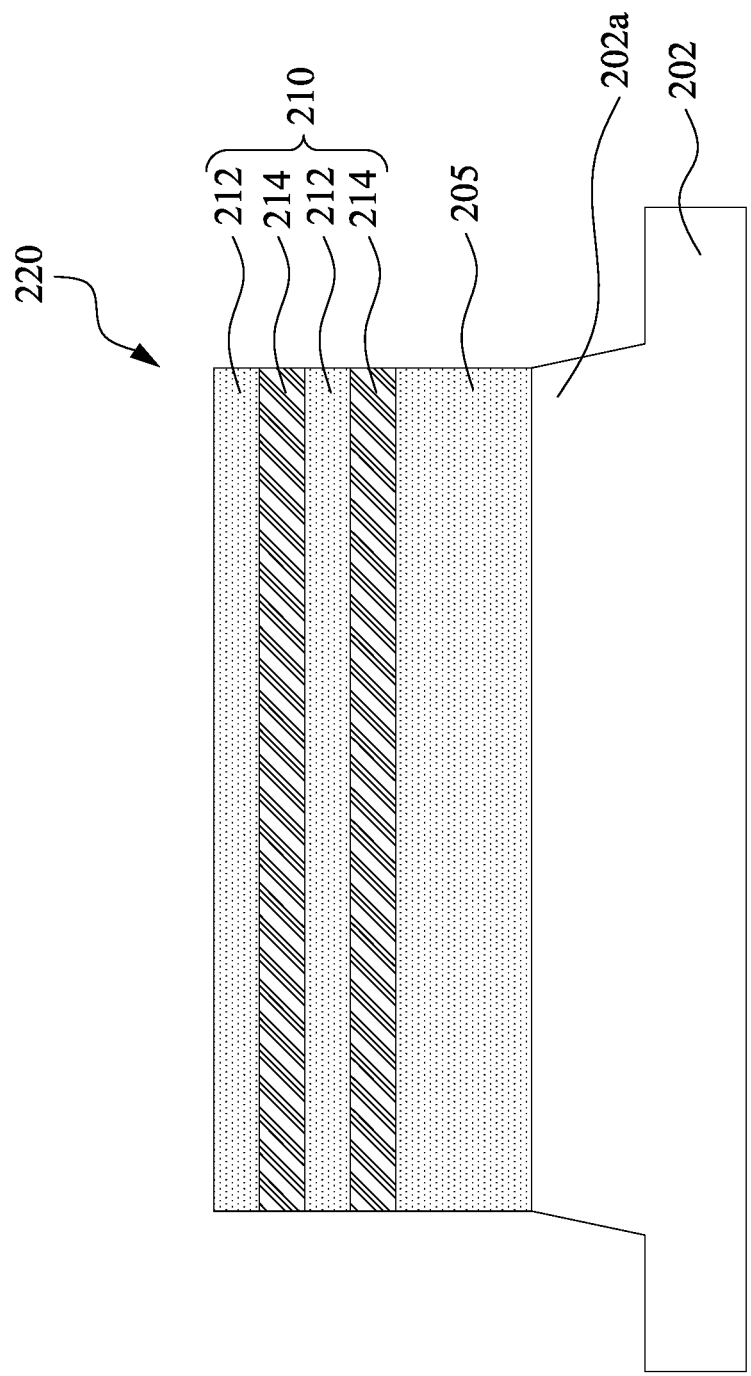
Figure 2C:
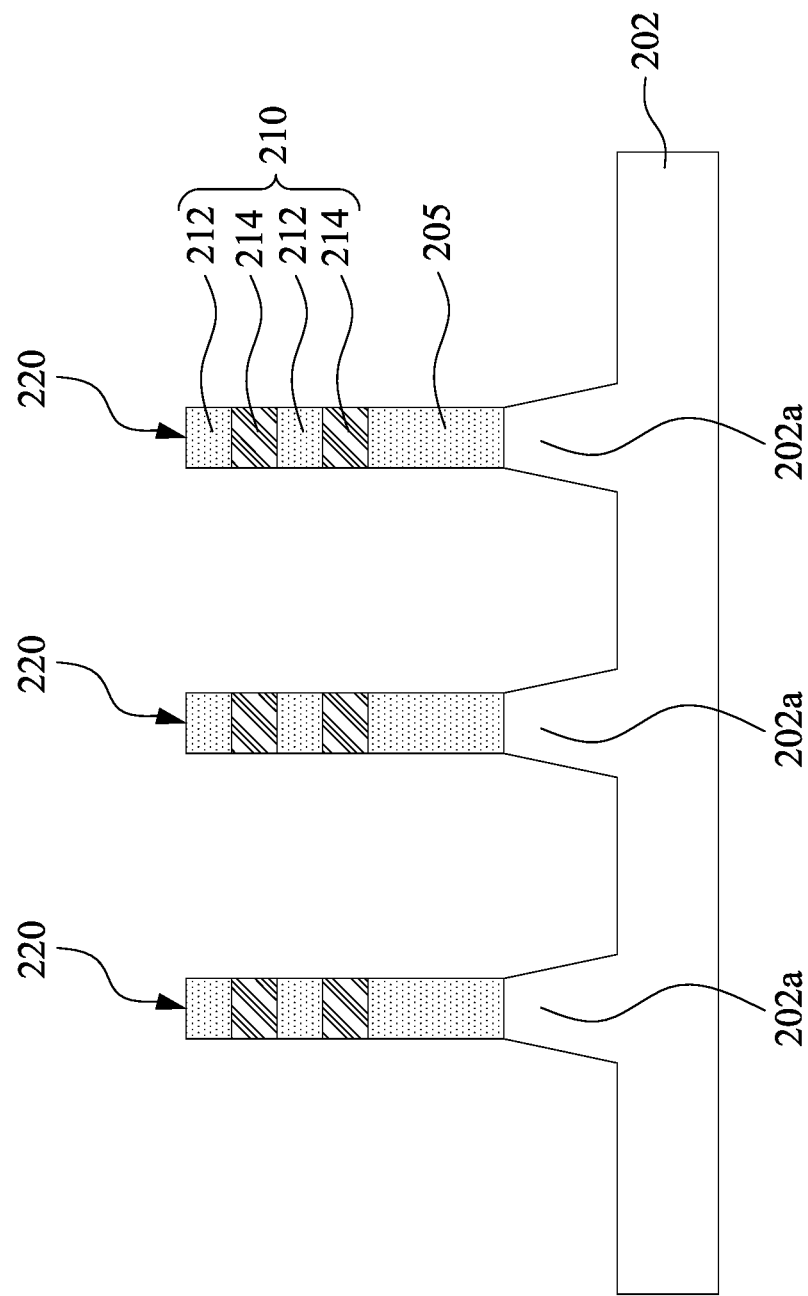

Reference is made to FIGS. 2A-2C. FIG. 2A is a top view of the structure 100. FIGS. 2B and 2C are cross-sectional views taken along sections B-B and C-C in FIG. 2A respectively. The multilayer stack 210' and the bottom sacrificial layer 205' of FIGS. 1A-1C are patterned to form fins 220 (i.e., multilayer stacks 210 and bottom sacrificial layers 205). The fins 220 result from the hard mask 203 (shown in FIGS. 1A-1C) formed over a portion of the topmost sacrificial layer 212. When the multilayer stack 210 is patterned, a portion of the underlying semiconductor substrate 202 is also removed. The fins 220 include protruded portions 202a of the semiconductor substrate 202. Then, the hard mask 203 of FIGS. 1A to 1C is removed from the topmost sacrificial layer 212 as shown in FIGS. 2A-2C.

Figure 3A:
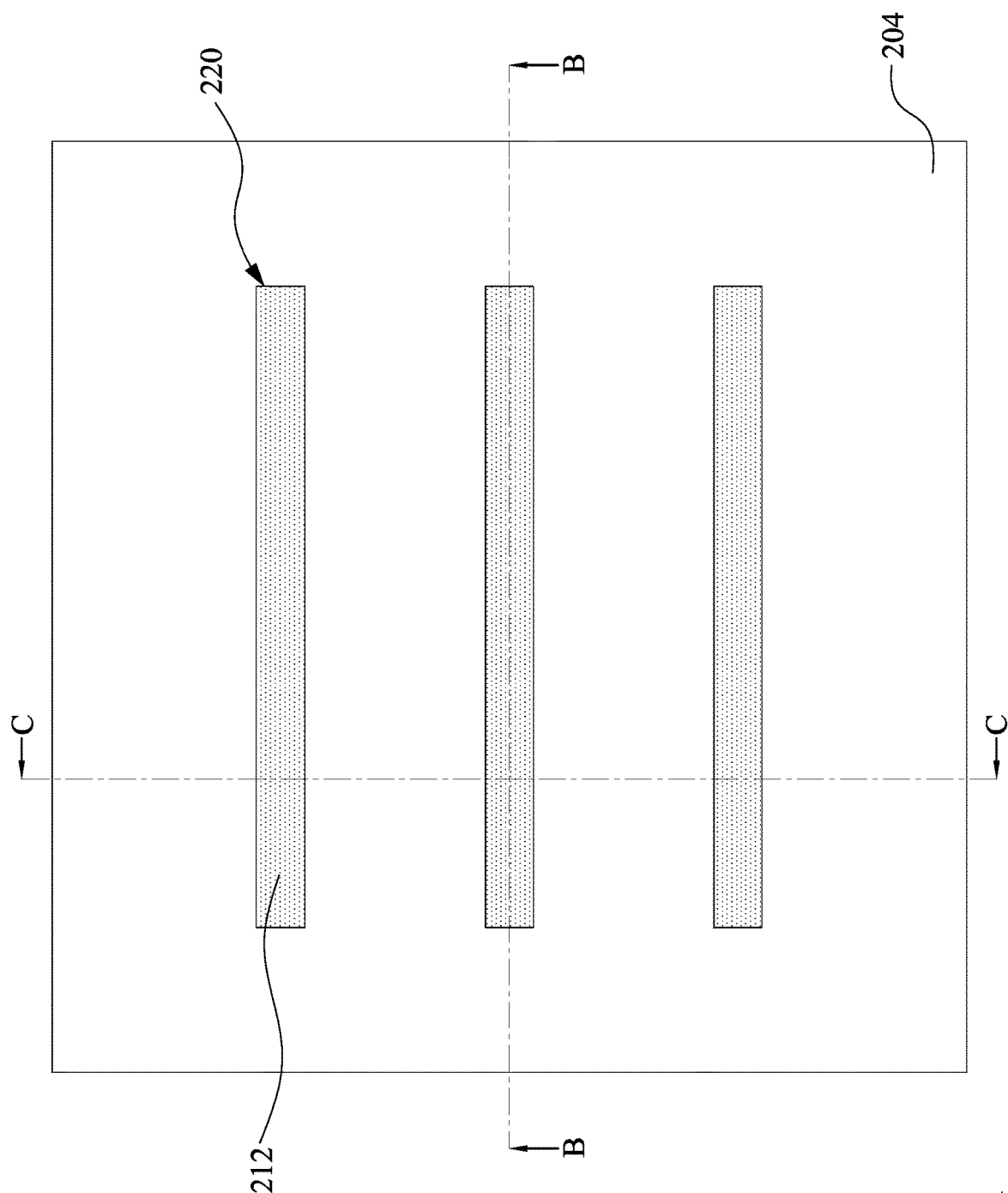
Figure 3B:
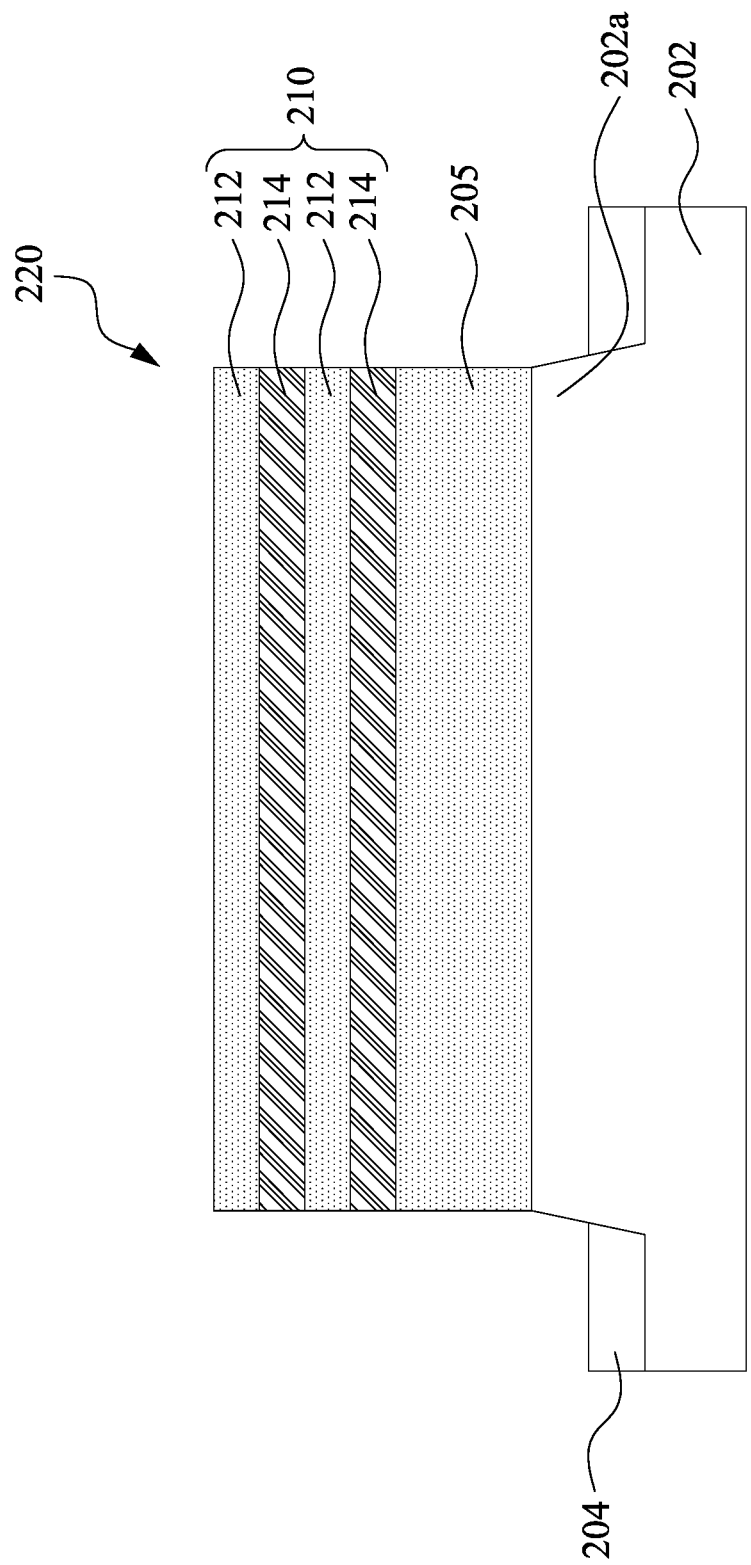
Figure 3C:
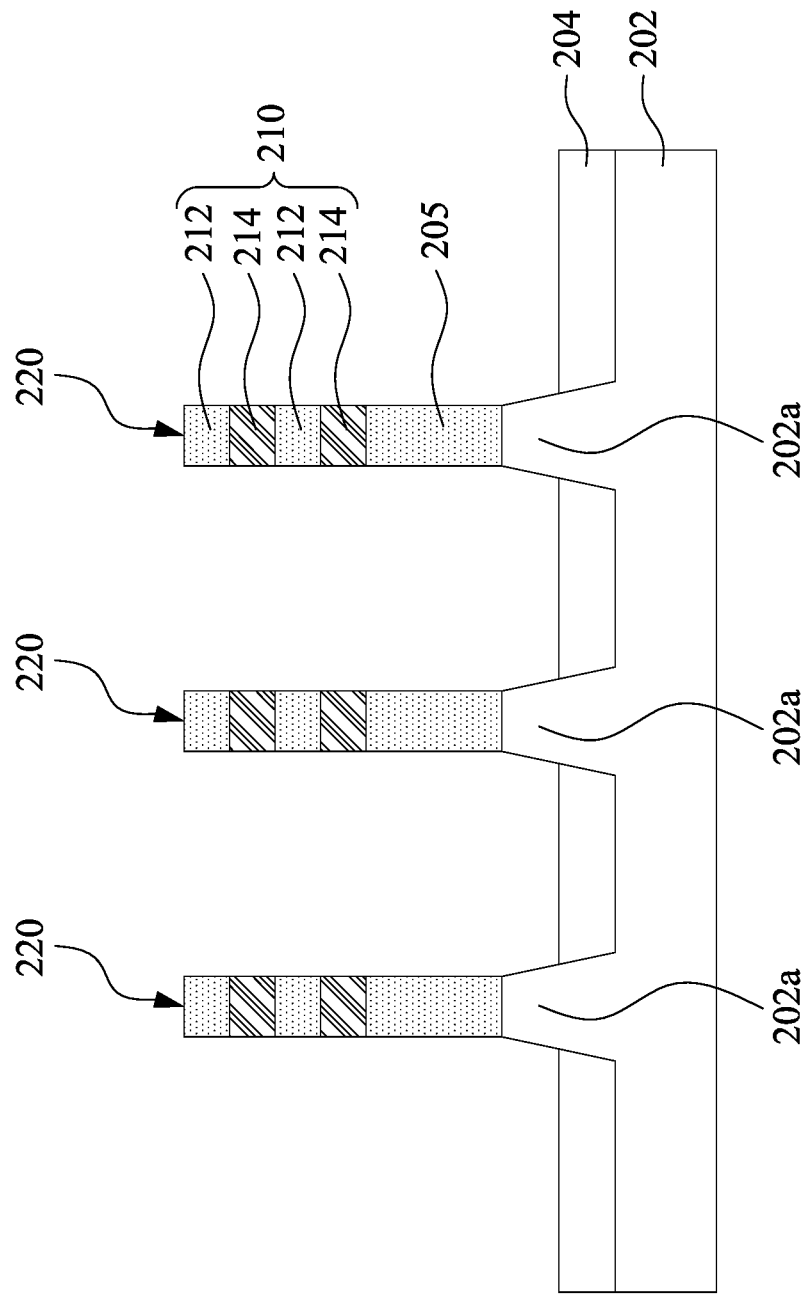

Reference is made to FIGS. 3A-3C. FIG. 3A is a top view of the structure 100. FIGS. 3B and 3C are cross-sectional views taken along sections B-B and C-C in FIG. 3A respectively. After the forming of the fins 220, an isolation material is deposited to form isolation structures 204 at least in the spaces between the fins 220. An anisotropic etch is used to recess the isolation material into the semiconductor substrate 202 at the base of the fins 220. The fins 220 are exposed above the isolation structures 204. A top portion of the protruded portion 202a of the semiconductor substrate 202 is not covered by the isolation structures 204. As shown in FIGS. 3B and 3C, from the top surface of the isolation structures 204, a total of two sacrificial layers 212 and two nanowires 214 are exposed. The sacrificial layer 212 now caps the fins 220.

Figure 4A:
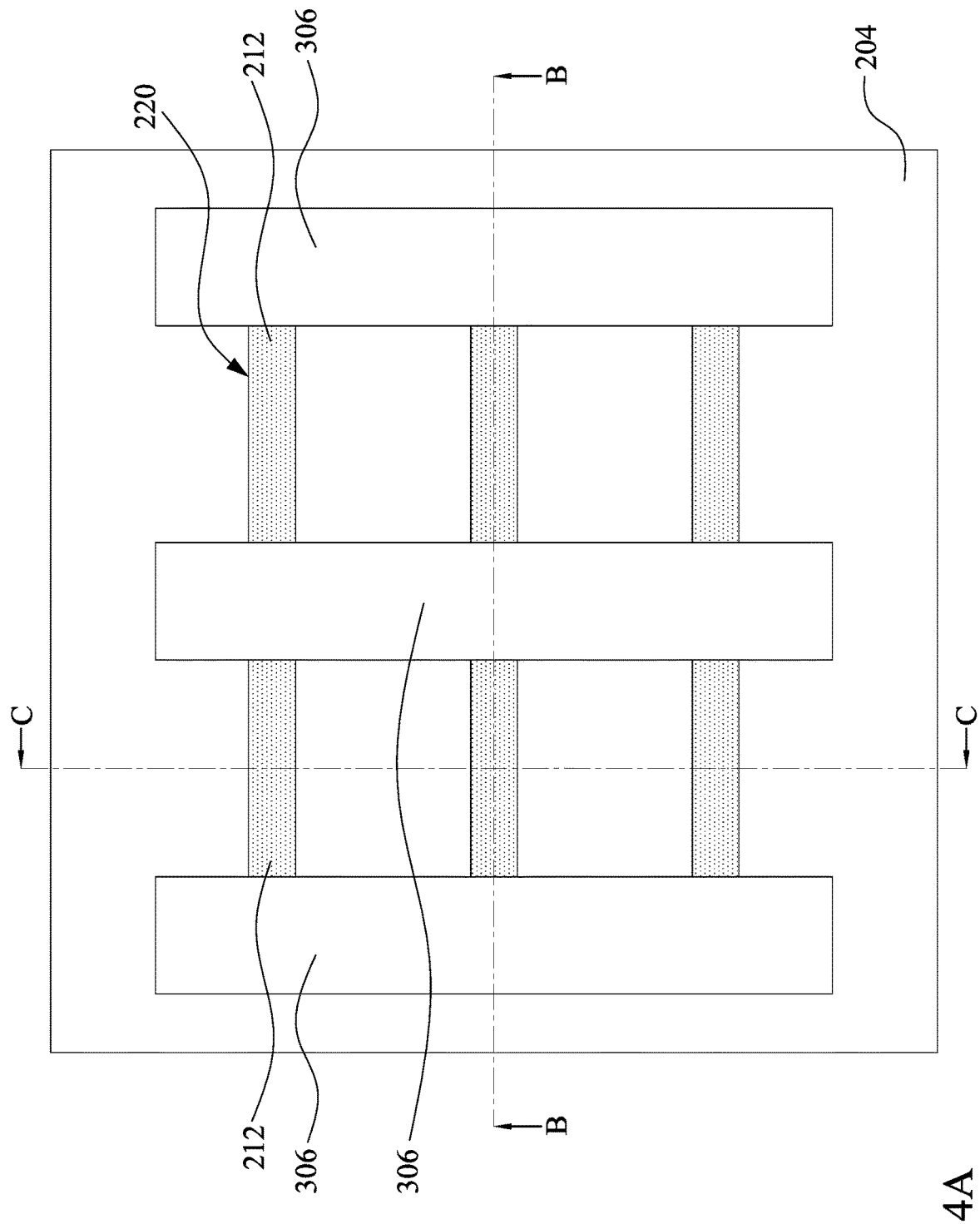
Figure 4B:
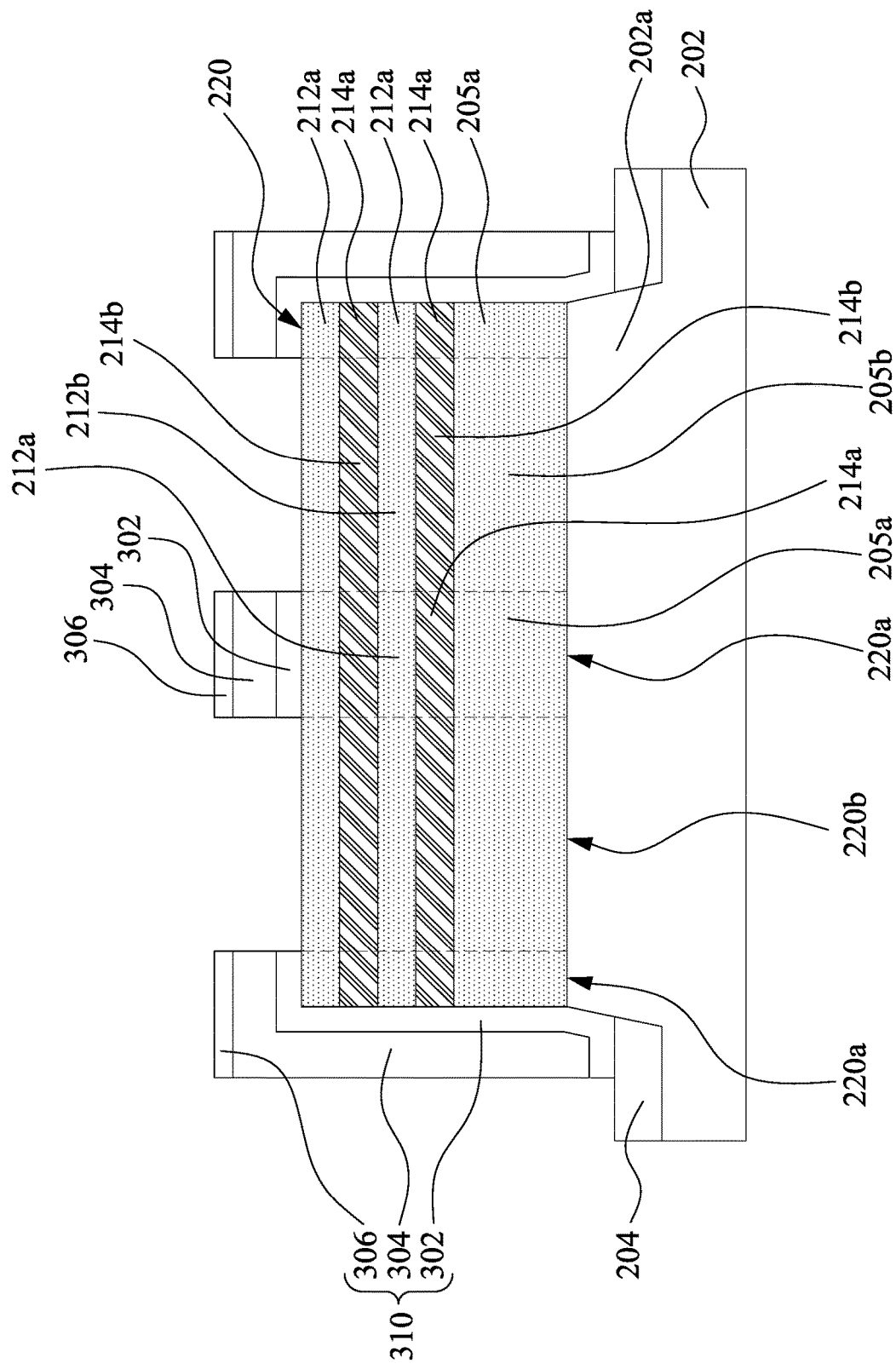
Figure 4C:
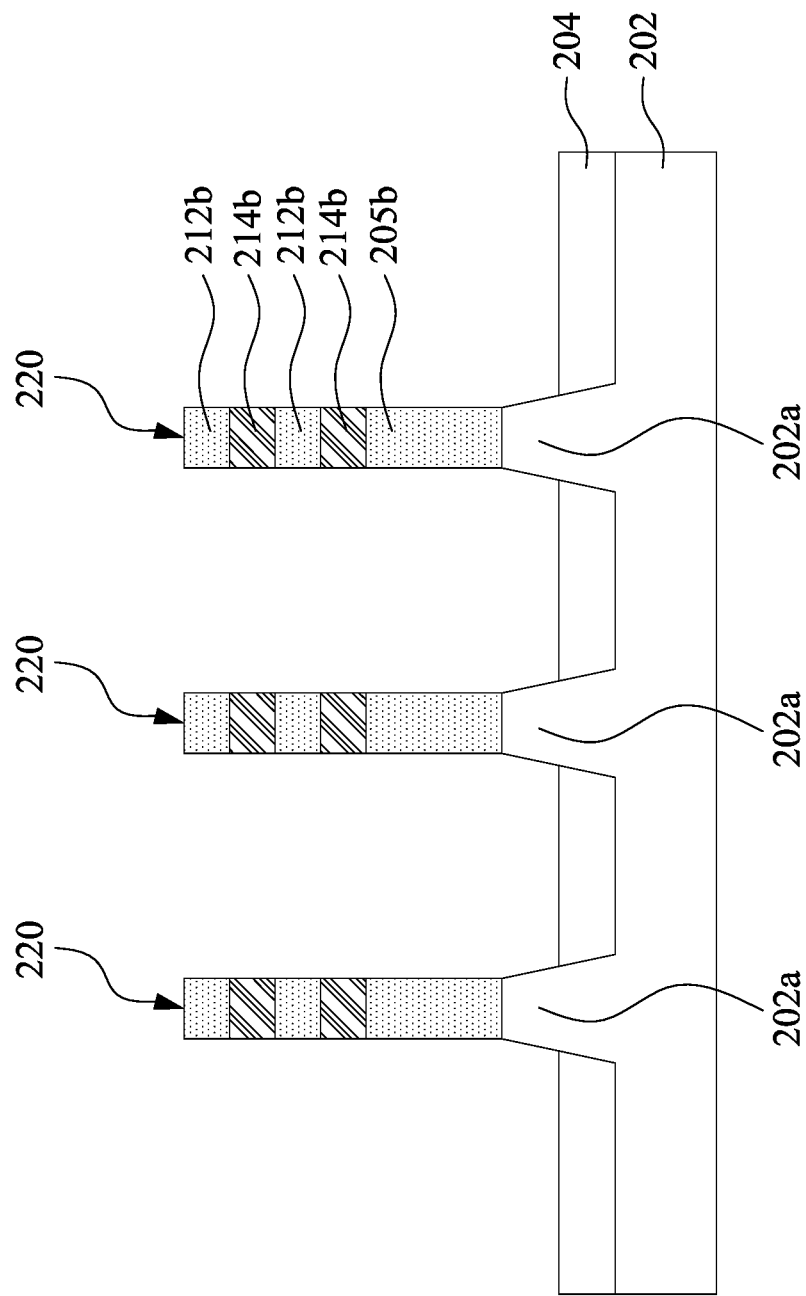

Reference is made to FIGS. 4A-4C. FIG. 4A is a top view of the structure 100. FIGS. 4B and 4C are cross-sectional views taken along sections B-B and C-C in FIG. 4A respectively. Three rows of dummy gate structures 310 (in the positions of hard masks 306 shown in top view in FIG. 4A) are formed across the fins 220, disposed on and in contact with the semiconductor substrate 202. At least one of the dummy gate structures 310 may include a gate dielectric layer 302, a dummy gate electrode layer 304, and a hard mask 306, and other materials may also be used. In some embodiments, the dummy gate structures 310 are deposited as a blanket layer and then patterned. That is, the fins 220 go along a first direction and the dummy gate structures 310 go along a second direction. The first and second directions are different, and may be substantially perpendicular to each other in some embodiments. As shown in FIGS. 4A and 4B, the dummy gate structures 310 at either ends of the fins 220 anchor the fins 220, and therefore the anchoring dummy gate structures 310 have portions over the fins 220 and the remaining portion touches down to the isolation structures 204. In some embodiments, the gate dielectric layer 302 may be made of, such as, hafnium oxide ($HfO_2$), zirconium oxide ($ZrO_2$) or lanthanum oxide ($La_2O_3$), the dummy gate electrode layer 304 may be made of polysilicon, and the hard mask 306 may be made of oxide and/or nitride materials.

As shown in FIG. 4B, at least one of the fins 220 has channel regions 220a and source and drain regions 220b. The dummy gate structures 310 define the channel regions 220a and the source and drain regions 220b of the fins 220. The dummy gate structures 310 are straddle and disposed on the fins 220 to form channel regions 220a below it, and the source and drain regions 220b of the fins 220 are exposed from the dummy gate structures 310. The bottom sacrificial layer 205, the sacrificial layers 212 and the nanowires 214 in the channel regions 220a are referred to as first bottom sacrificial portions 205a, first sacrificial portions 212a, and first nanowire portions 214a respectively, and that in the source and drain regions 220b are referred to as second bottom sacrificial portions 205b, second sacrificial portions 212b, and second nanowire portions 214b respectively. In other words, the channel regions 220a are covered by the gate dielectric layer 302, the dummy gate electrode layer 304, and nitride hard mask 306. The first nanowire portions 214a extend through the dummy gate structures 310 and are disposed on the semiconductor substrate 202.

Figure 5A:
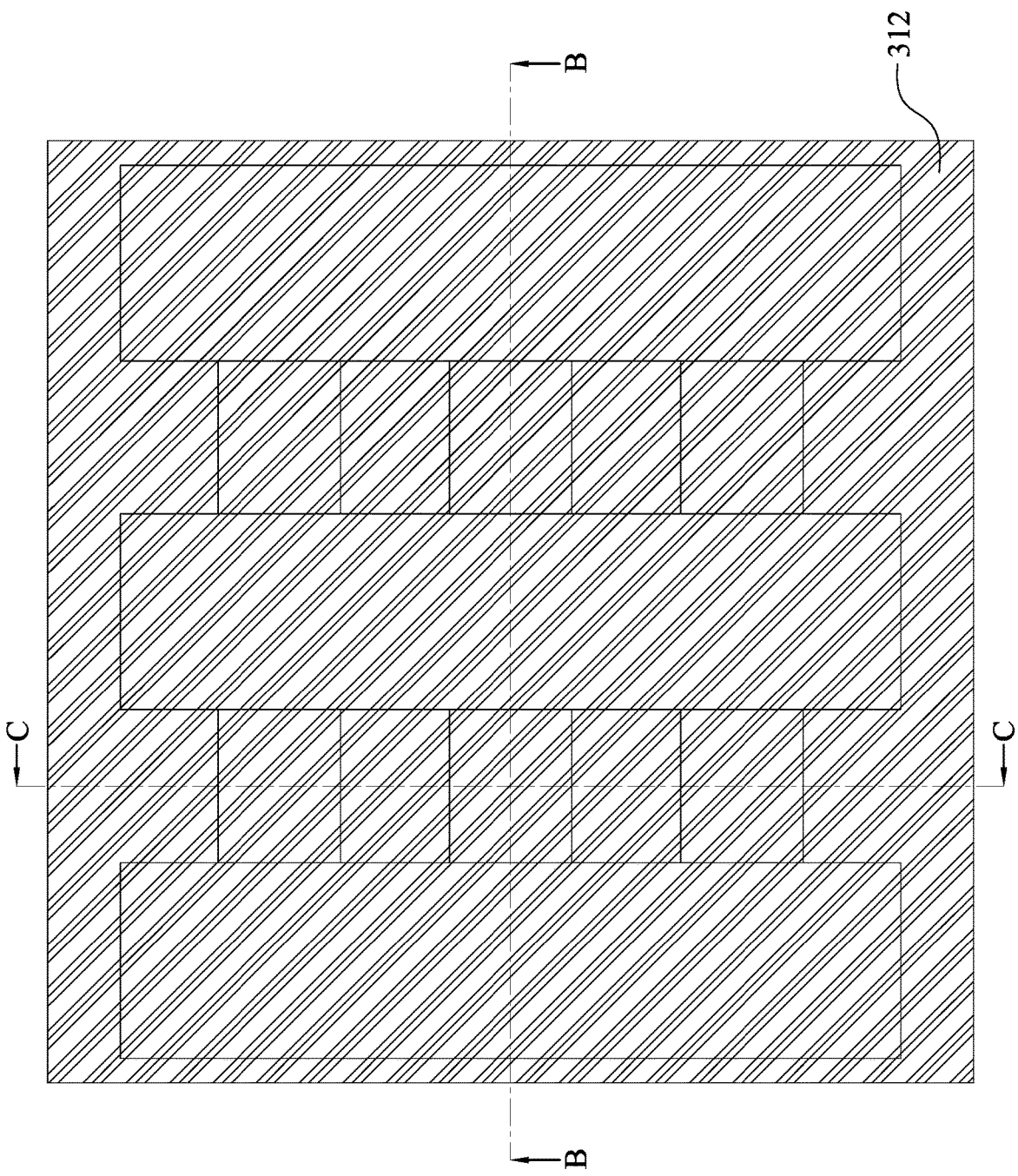
Figure 5B:
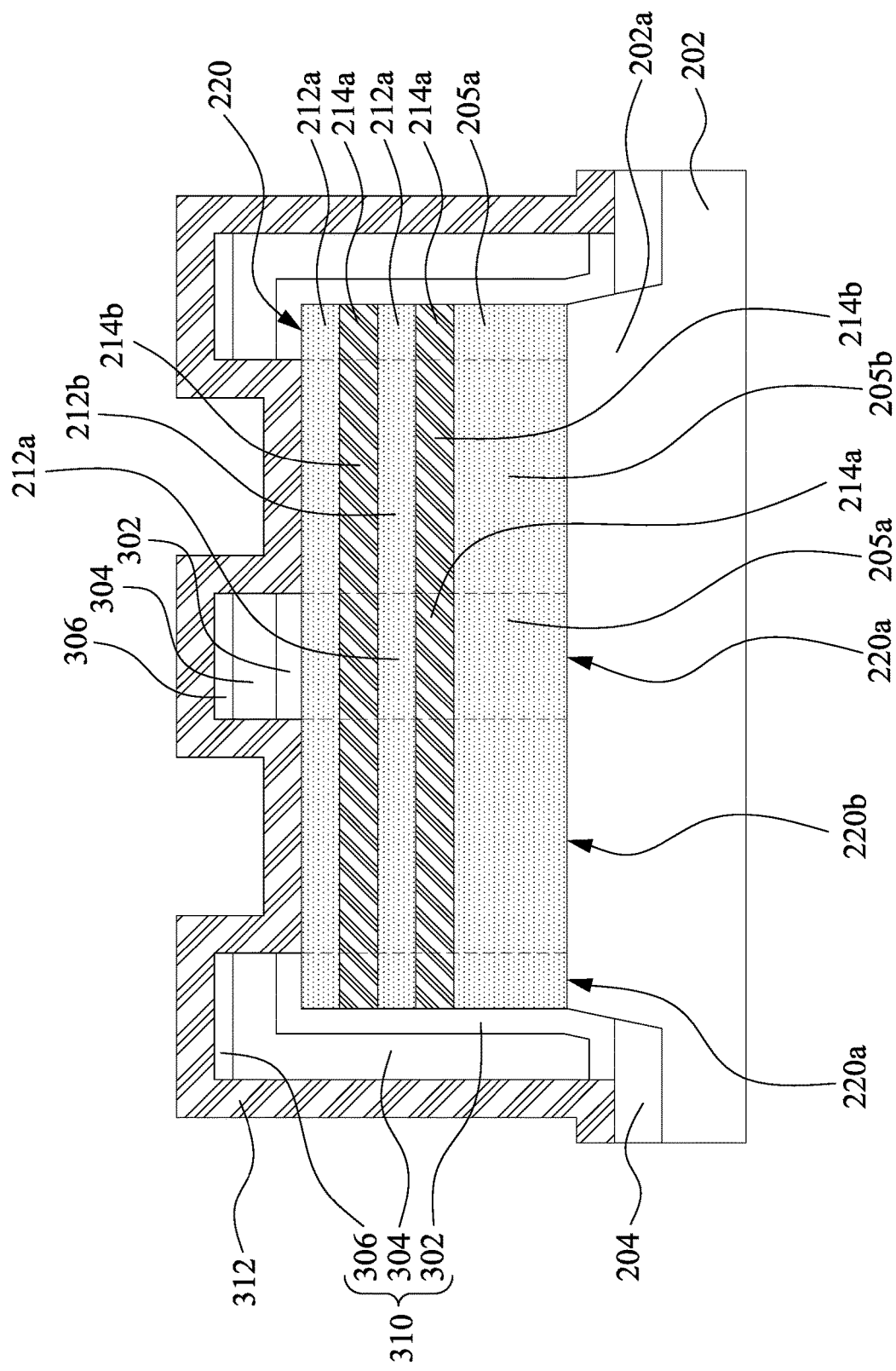
Figure 5C:
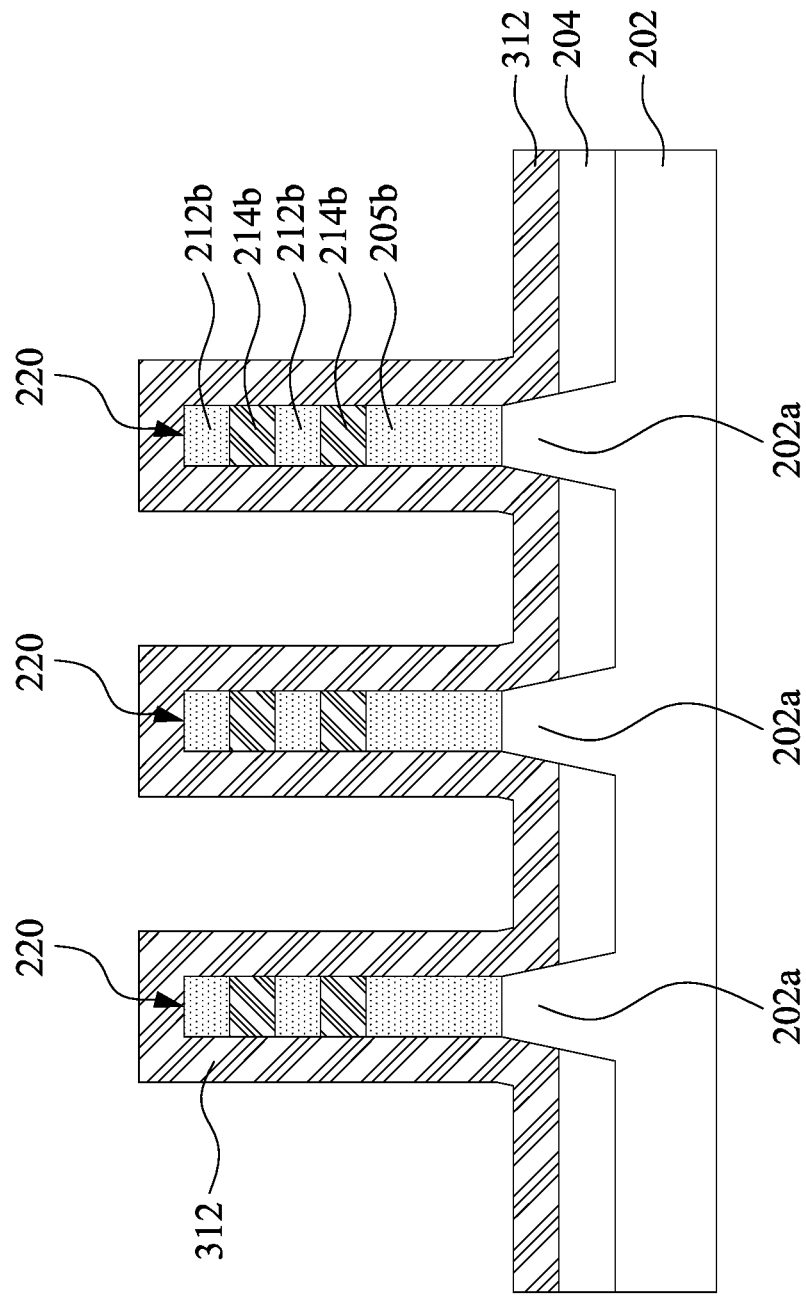

Reference is made to FIGS. 5A-5C. FIG. 5A is a top view of the structure 100. FIGS. 5B and 5C are cross-sectional views taken along sections B-B and C-C in FIG. 5A respectively. After the deposition of the dummy gate structures 310, a dummy spacer 312 is deposited as a blanket layer, and is conformal formed over the dummy gate structures 310 and the fins 220. The dummy spacer 312 can be made of a material, such as, oxide or nitride, and the instant disclosure is not limited thereto.

Figure 6A:
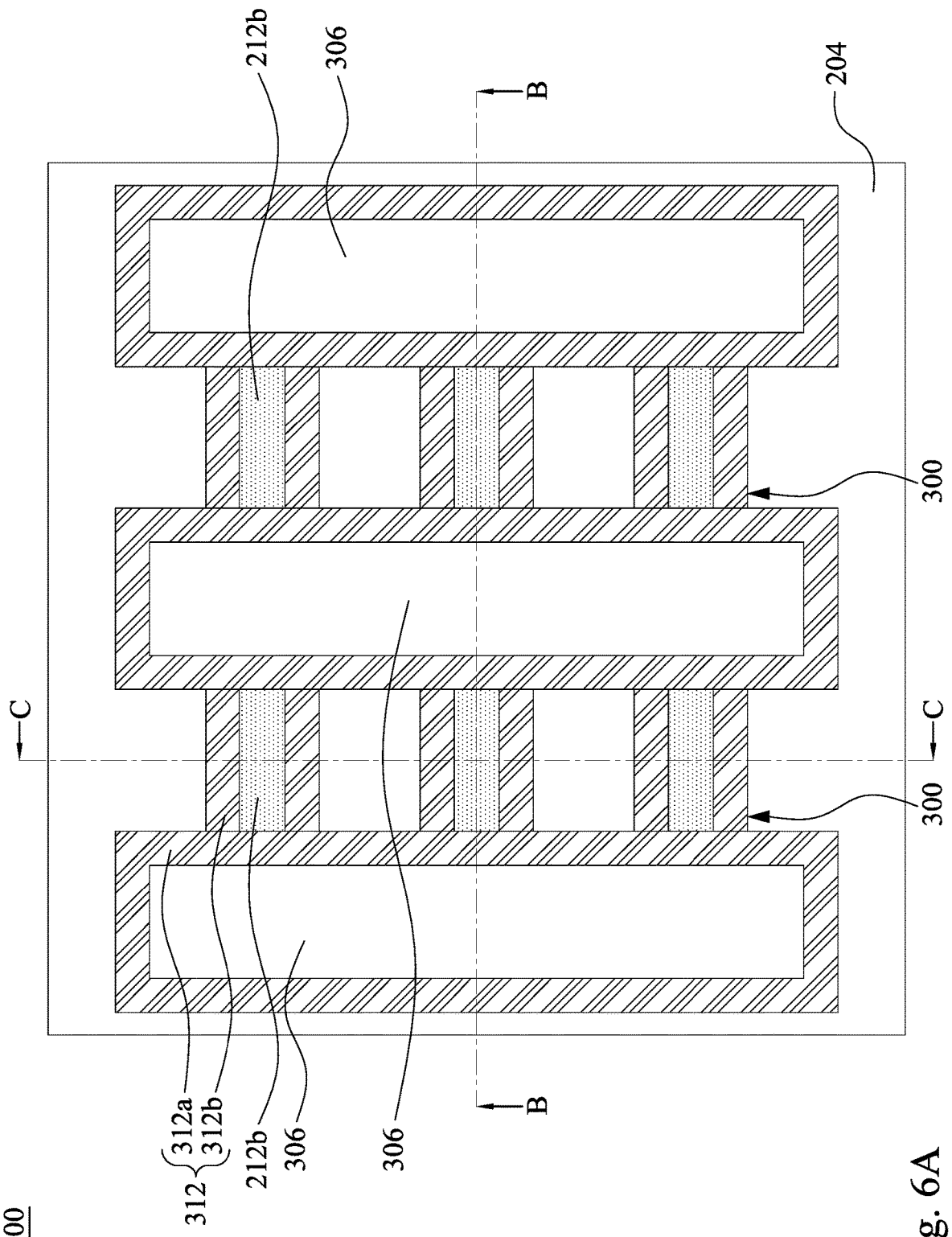
Figure 6B:
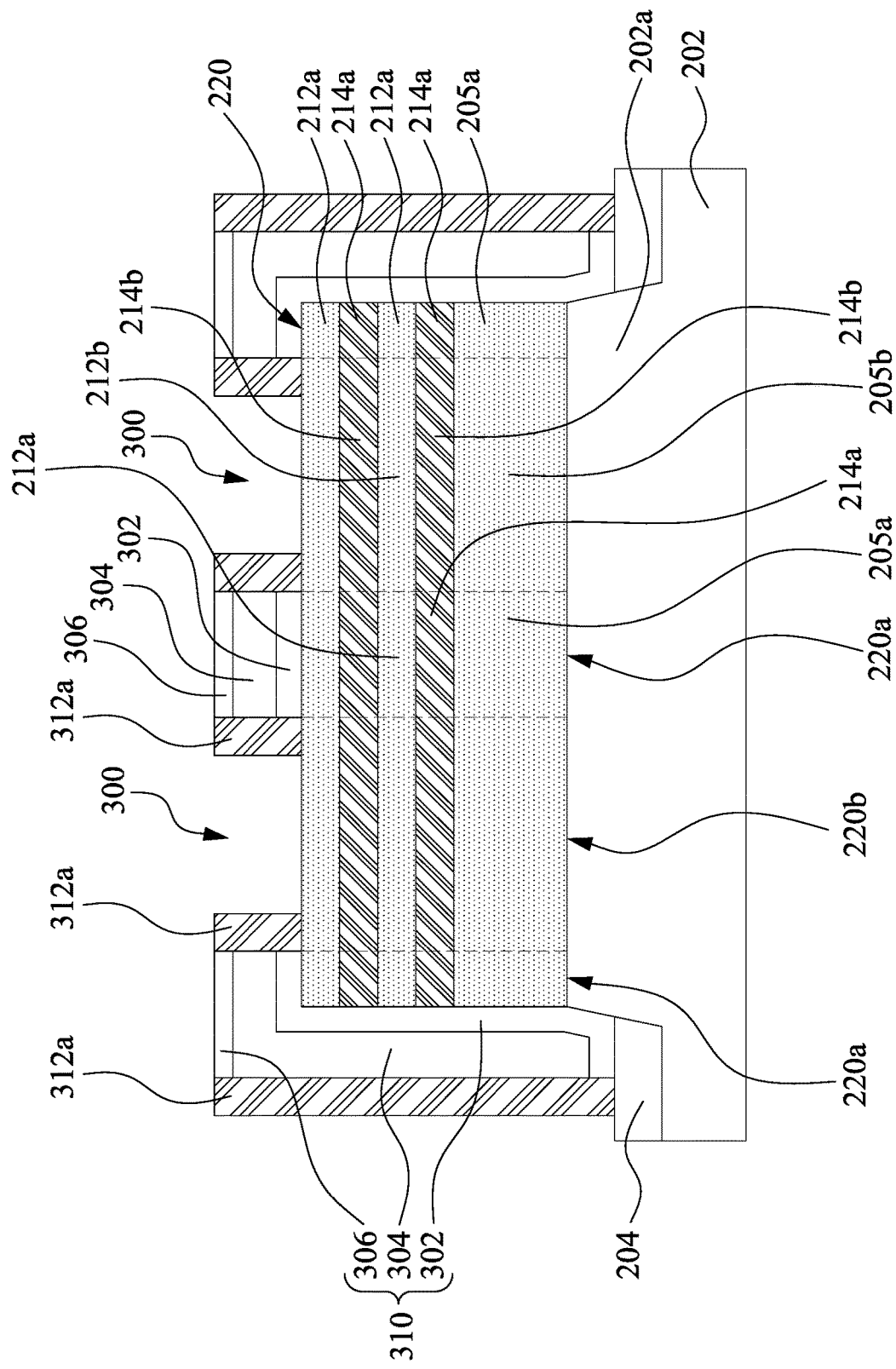
Figure 6C:
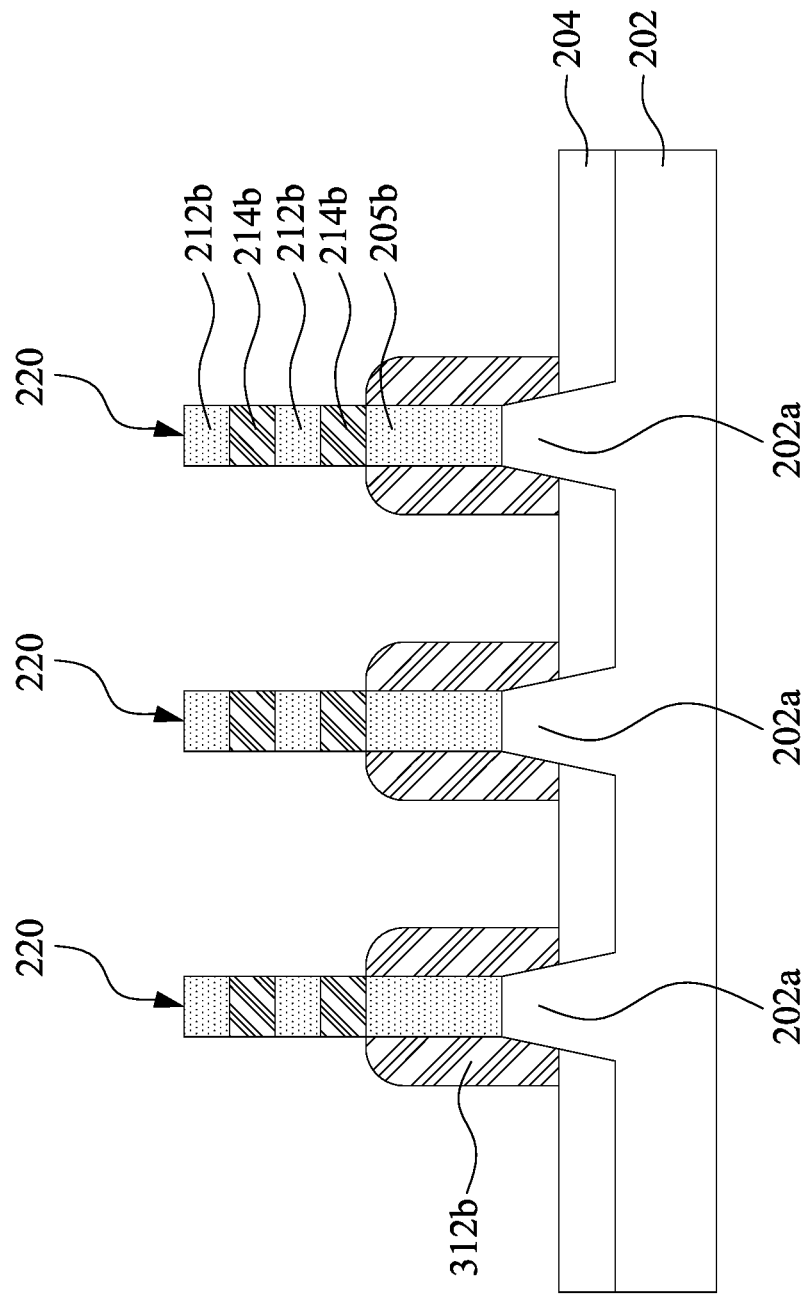

Reference is made to FIGS. 6A-6C. FIG. 6A is a top view of the structure 100. FIGS. 6B and 6C are cross-sectional views taken along sections B-B and C-C in FIG. 6A respectively. After the deposition of the dummy spacer 312 (see FIGS. 5A-5C), an anisotropically etching is performed on the surface of the dummy spacer 312 to form first spacer portions 312a and second spacer portions 312b. Specifically, the etching process removes the dummy spacer 312 on the top portion of the dummy gate structures 310 to expose the hard mask 306, and removes that on the top portion of the fins 220 exposed from the dummy gate structures 310 to expose the nanowires 214. Then, the dummy spacer 312 is left on sidewalls of the dummy gate structures 310, left on the sidewalls of the top portion of the protruded portion 202a, and left on sidewalls of the sacrificial layer 212 in contact with the protruded portion 202a. Spaces 300 are left between the spacers 312. In the case, the spacers 312 formed on the side walls of dummy gate structures 310 can be referred to as first spacer portions 312a, and that formed on the sidewalls of fins 220 exposed from the dummy gate 310 can be referred to as second spacer portions 312b.

Figure 7A:
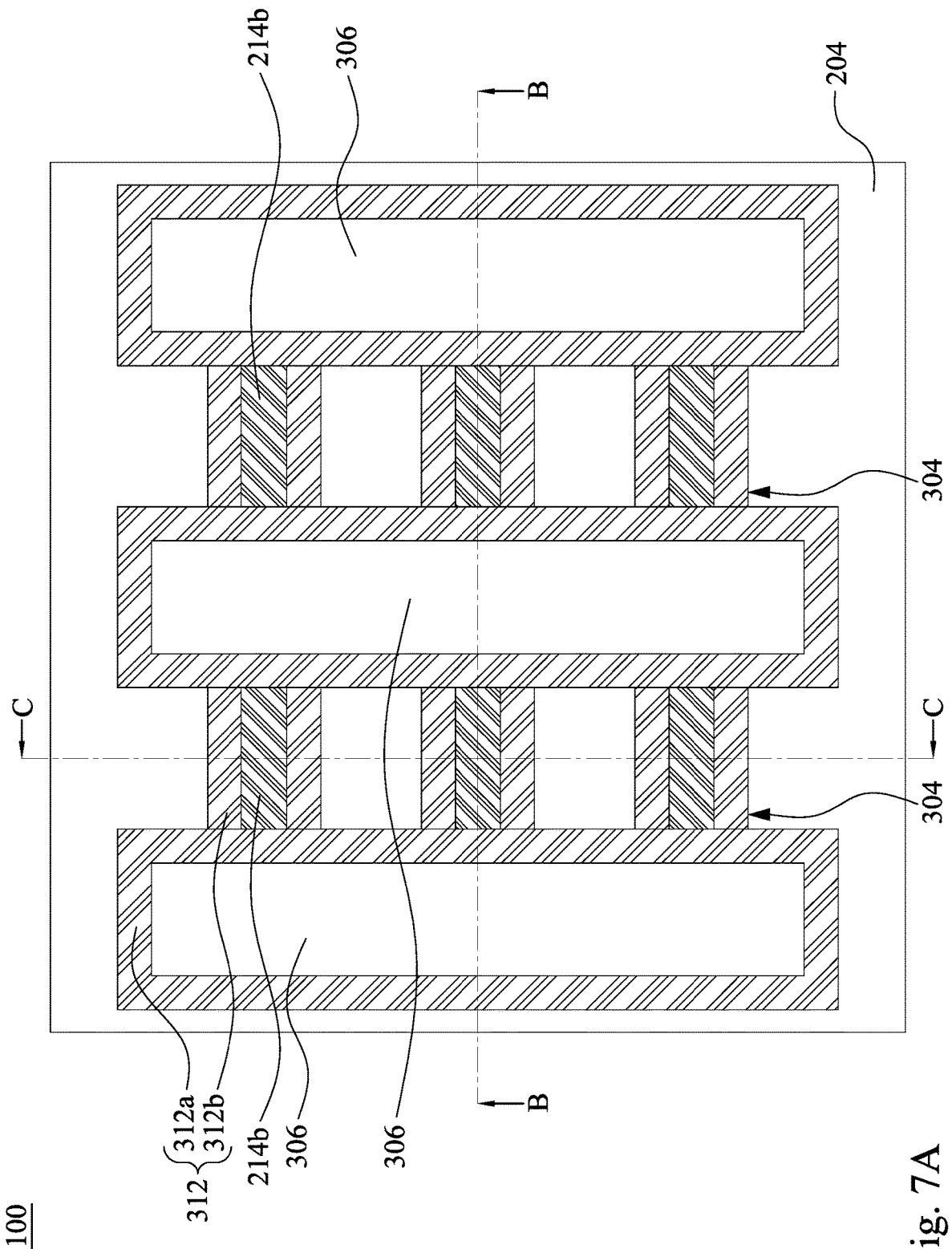
Figure 7B:
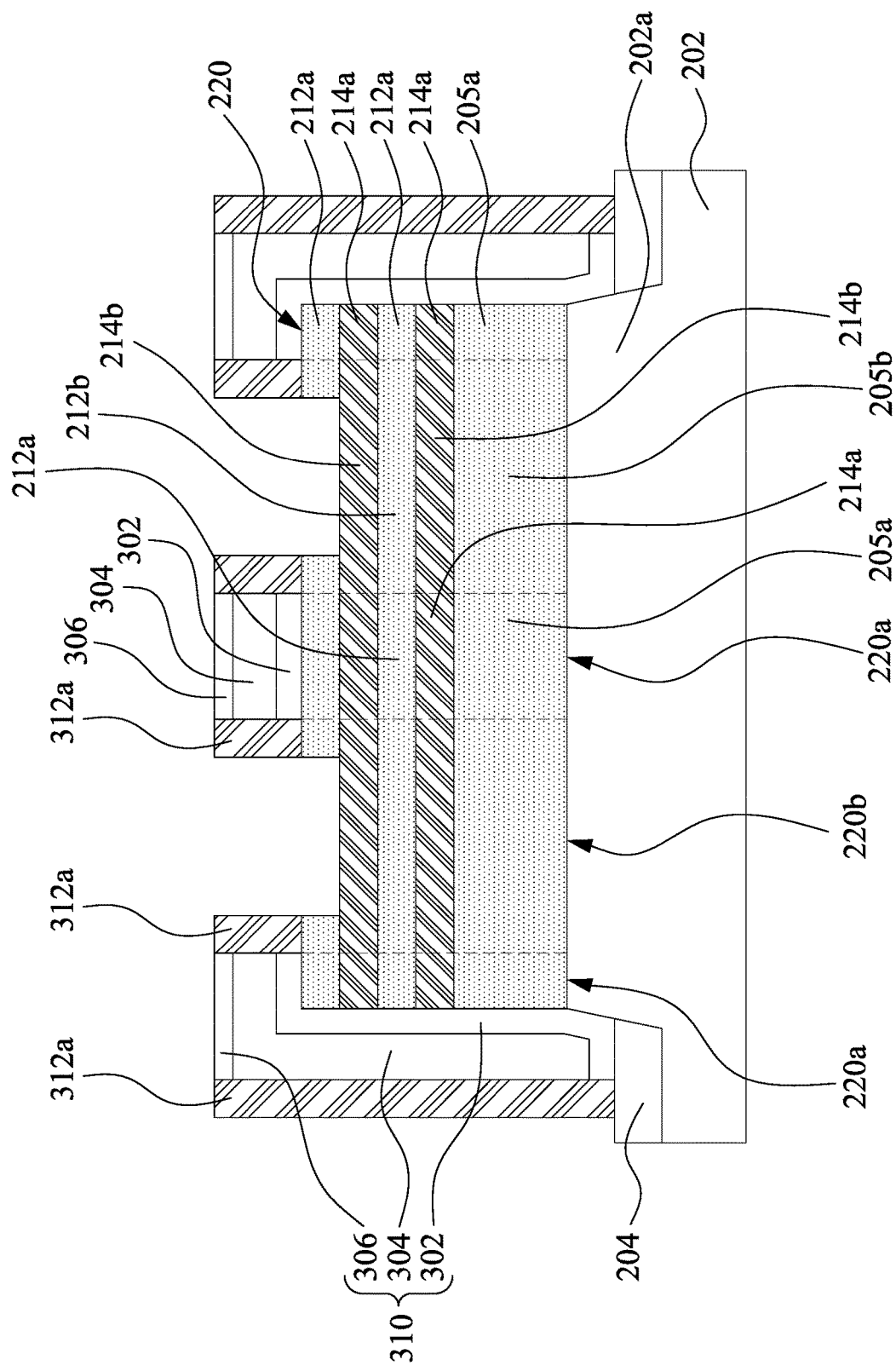
Figure 7C:
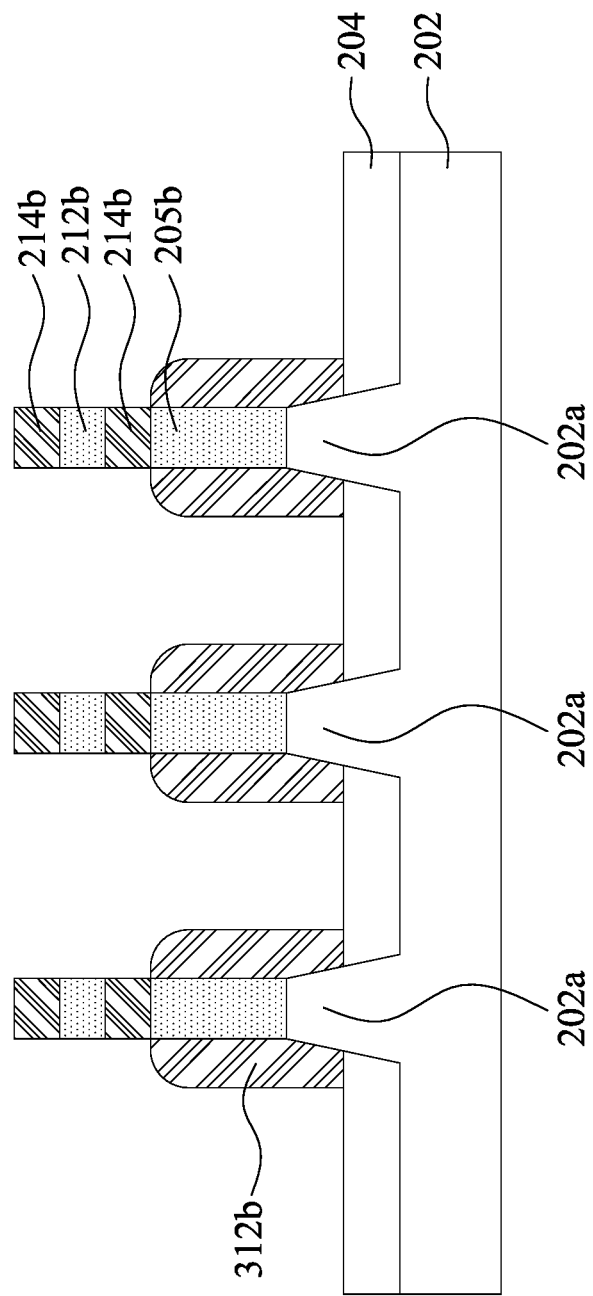

Reference is made to FIGS. 7A-7C. FIG. 7A is a top view of the structure 100. FIGS. 7B and 7C are cross-sectional views taken along sections B-B and C-C in FIG. 7A respectively. After the formation of the first spacer portions 312a and the second spacer portions 312b, removing the uppermost second sacrificial portions 212b of the source and drain regions 220b. That is, a removing process is performed to remove portions of the second sacrificial portions 212b farthest to the semiconductor substrate 202 to expose the first nanowire portions 214a of the nanowires 214 farthest to the semiconductor substrate 202.

Figure 8A:
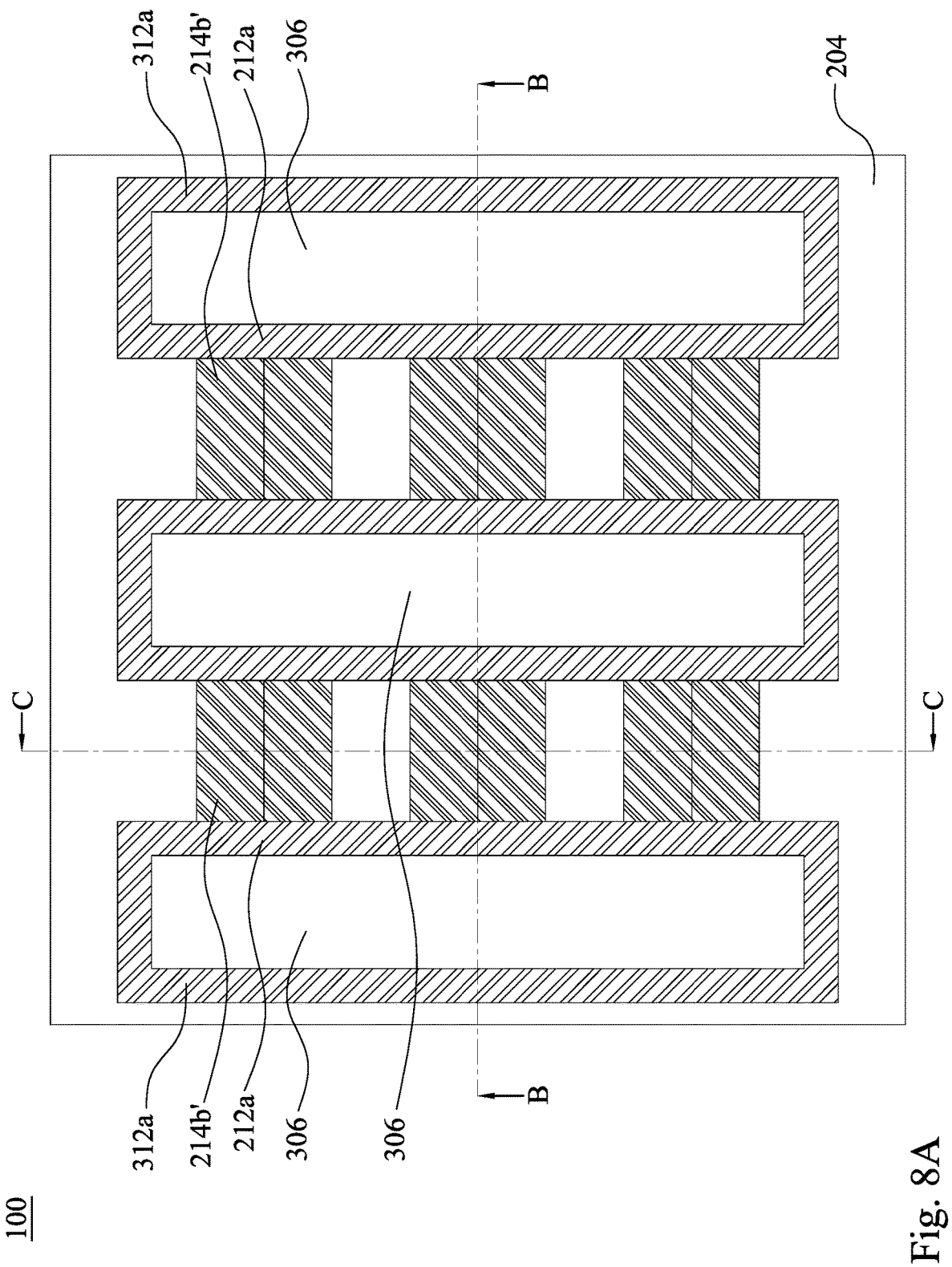
Figure 8B:
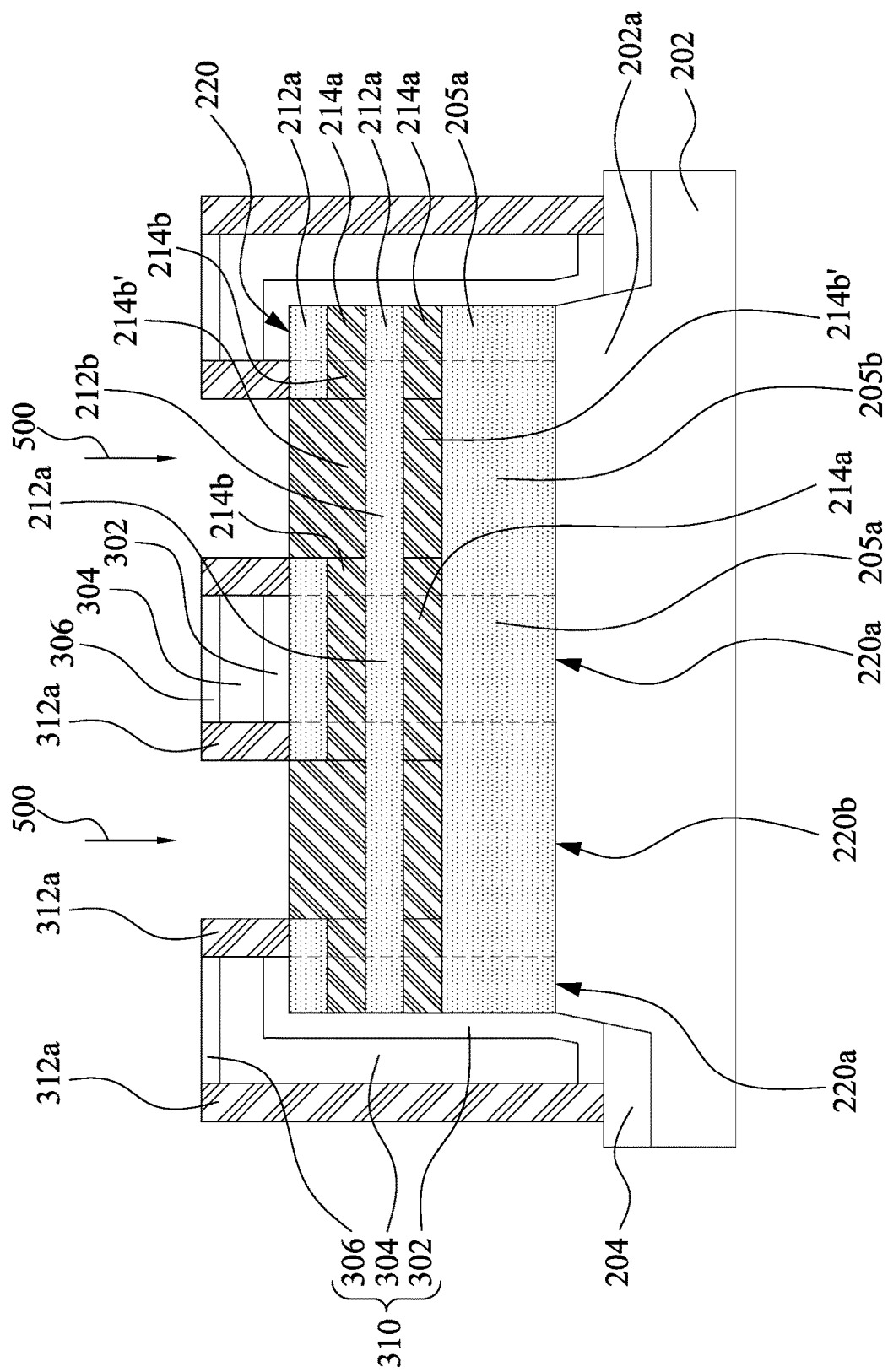
Figure 8C:
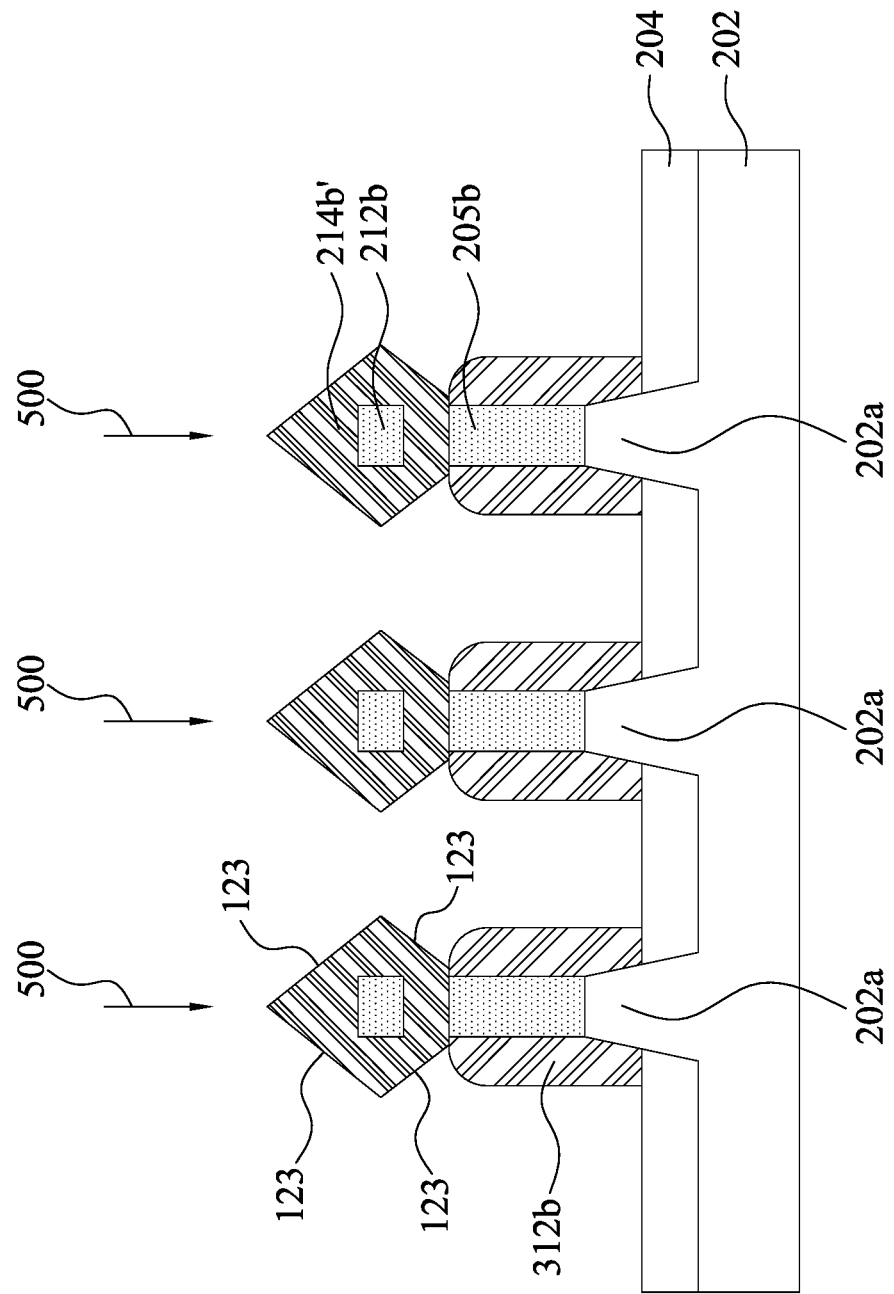

Reference is made to FIGS. 8A-8C. FIG. 8A is a top view of the structure 100. FIGS. 8B and 8C are cross-sectional views taken along sections B-B and C-C in FIG. 8A respectively. After the removing of the portions of the second sacrificial portions 212b farthest to the semiconductor substrate 202, forming the epitaxy structures 214b' (can also be referred to as source/drain regions) including the second sacrificial portions 212b of the source and drain regions 220b. The epitaxy structures 214b' are formed upon the second nanowire portions 214b of the nanowires 214 and in contact with the second nanowire portions 214b. That is, the epitaxy structures 214b' are formed by a selective epitaxial growth process 500 from the second nanowire portions 214b generally outside the gate structures 310. Specifically, the second nanowire portions 214b may be thickened by epitaxial growing, such as, Ge, with intrinsic or undoped materials to form the epitaxy structures 214b'. In some embodiments, the second nanowire portions 214b may be thickened by growth of in situ dopants that may be either n-type or p-type.

More specifically, the epitaxy structures 214b' may be grown from the second nanowire portions 214b and is formed wrapping around and merging the second nanowire portions 214b of the nanowires 214. Furthermore, the epitaxy structures 214b' surround the second sacrificial portions 212b (are also referred to as sacrificial material 212b). In other words, the second sacrificial portions 212b of the source and drain regions 220b are embedded in the epitaxy structure 214b', and the nanowires 214 including the first nanowire portions 214a and the second nanowire portions 214b extend through the epitaxy structure 214b'. The epitaxy structures 214b' are separated from the semiconductor substrate 202. Specifically, the protruded portions 202a of the semiconductor substrate 202 is disposed under the epitaxy structure 214b' and is separated from the epitaxy structure 214b'. In the case, the protruded portions 202a are separated from the epitaxy structure 214b' by the second bottom sacrificial portions 205b of the bottom sacrificial layer 205.

In some embodiments, the epitaxy structures 214b' include spade-shaped epitaxial regions separated from each other. The epitaxy structures 214b' have facets 123 (see FIG. 8C). The facets 123 include upward facing facets and downward facing facets. The facets 123 may be on <111> planes of the epitaxy structures 214b'. In some embodiments, epitaxy growth is quickest from <100> planes and is slowest from <111> planes. For example, the semiconductor substrate 202 has a <100> orientation and sidewalls of the second nanowire portions 214b have a <110> orientation.

In some embodiments, the epitaxial growth process 500 may be performed by, such as, a chemical vapor deposition (CVD) process, a monolayer doping (MLD) process, a rapid thermal chemical vapor deposition (RTCVD) process, a low-energy plasma deposition (LEPD) process, an ultra-high vacuum chemical vapor deposition (UHVCVD) process, an atmospheric pressure chemical vapor deposition (APCVD) process, or a molecular beam epitaxy (MBE), and the instant disclosure is not limited thereto. In some embodiments, the epitaxy structures 214b' may be formed by other known or additional techniques than those described without deviating from the spirit of those embodiments herein claimed.

In some embodiments, in situ doping (ISD) is applied (e.g., by ion implantation) to form doped epitaxy structure 214b'. N-type and p-type FETs are formed by implanting different types of dopants to selected regions of the device to form the necessary junction(s). N-type devices may be formed by implanting arsenic (As) or phosphorous (P), and p-type devices may be formed by implanting boron (B). For example, the epitaxy structure 214b' may include materials such as SiP or SiGeB and any other suitable materials.

Figure 9A:
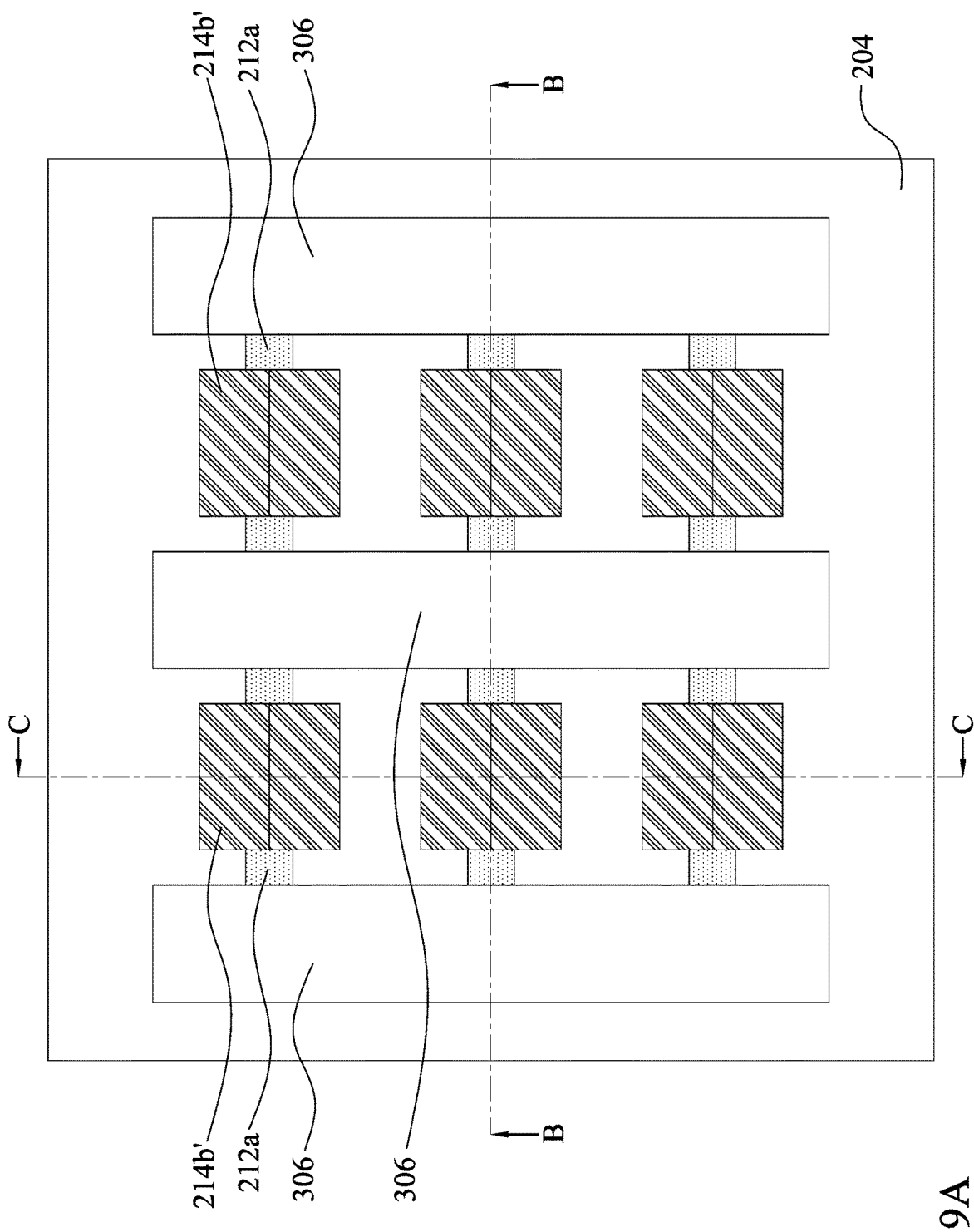
Figure 9B:
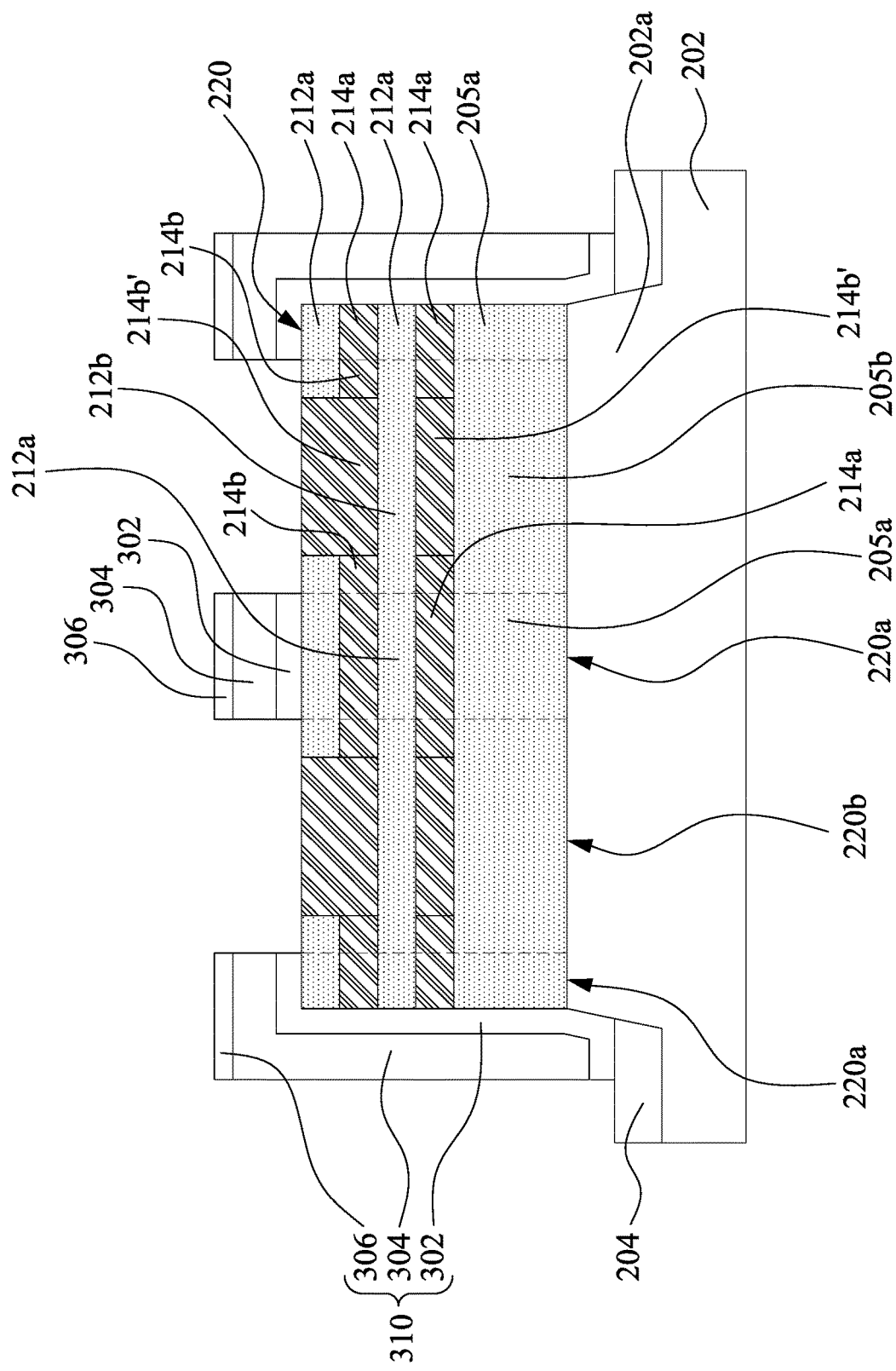
Figure 9C:
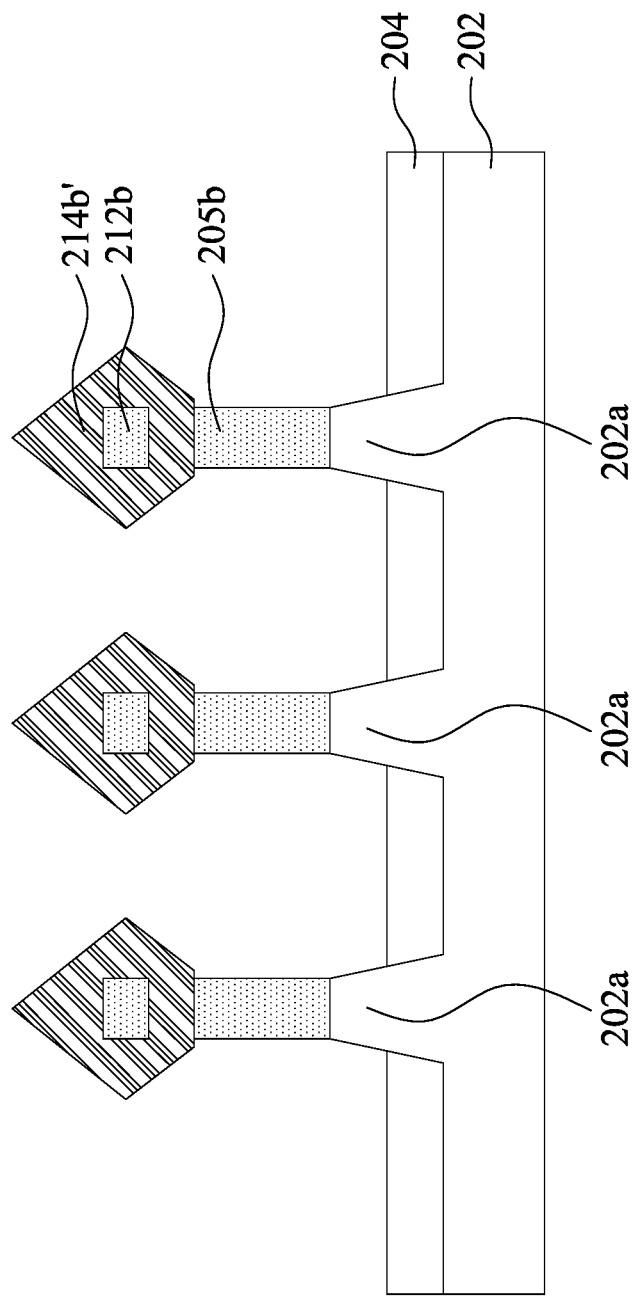

Reference is made to FIGS. 9A-9C. FIG. 9A is a top view of the structure 100. FIGS. 9B and 9C are cross-sectional views taken along sections B-B and C-C in FIG. 9A respectively. After the forming of the epitaxy structures 214b', removing the first spacer portions 312a and the second spacer portions 312b. Therefore, the second bottom sacrificial portions 205b of the bottom sacrificial layer 205 in the source/drain portions 220b are exposed. In some embodiments, the removal of the first spacer portions 312a and the second spacer portions 312b can be performed simultaneously utilizing a single etch. In some embodiments, the removal of the first spacer portions 312a and the second spacer portions 312b can be performed utilizing different etching steps and different etch chemistries. For example, the first spacer portions 312a and the second spacer portions 312b can be removed utilizing, such as, a mixture of HF and water and a mixture of $H_3PO_4$ and water, and the instant disclosure is not limited thereto.

Figure 10A:
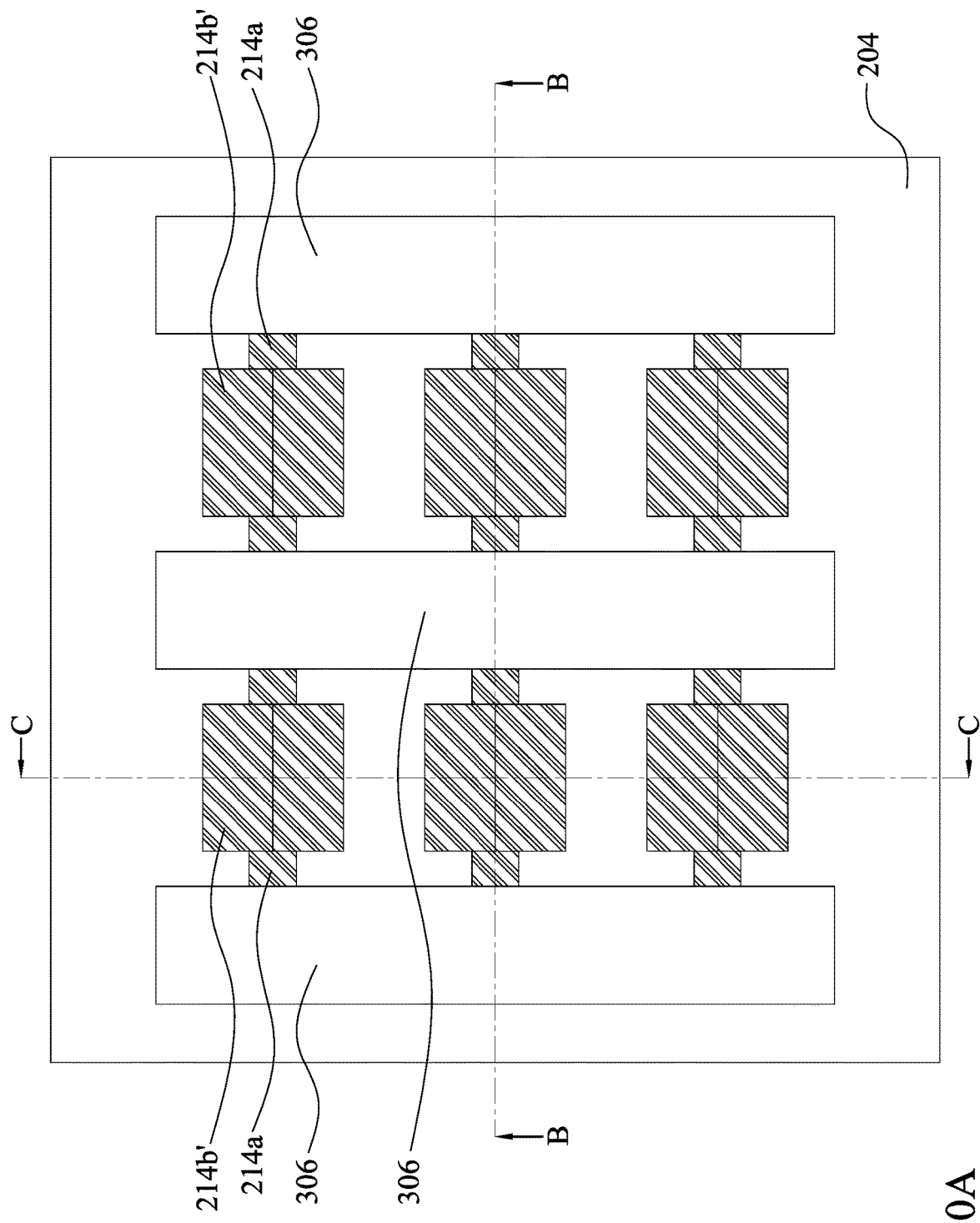
Figure 10B:
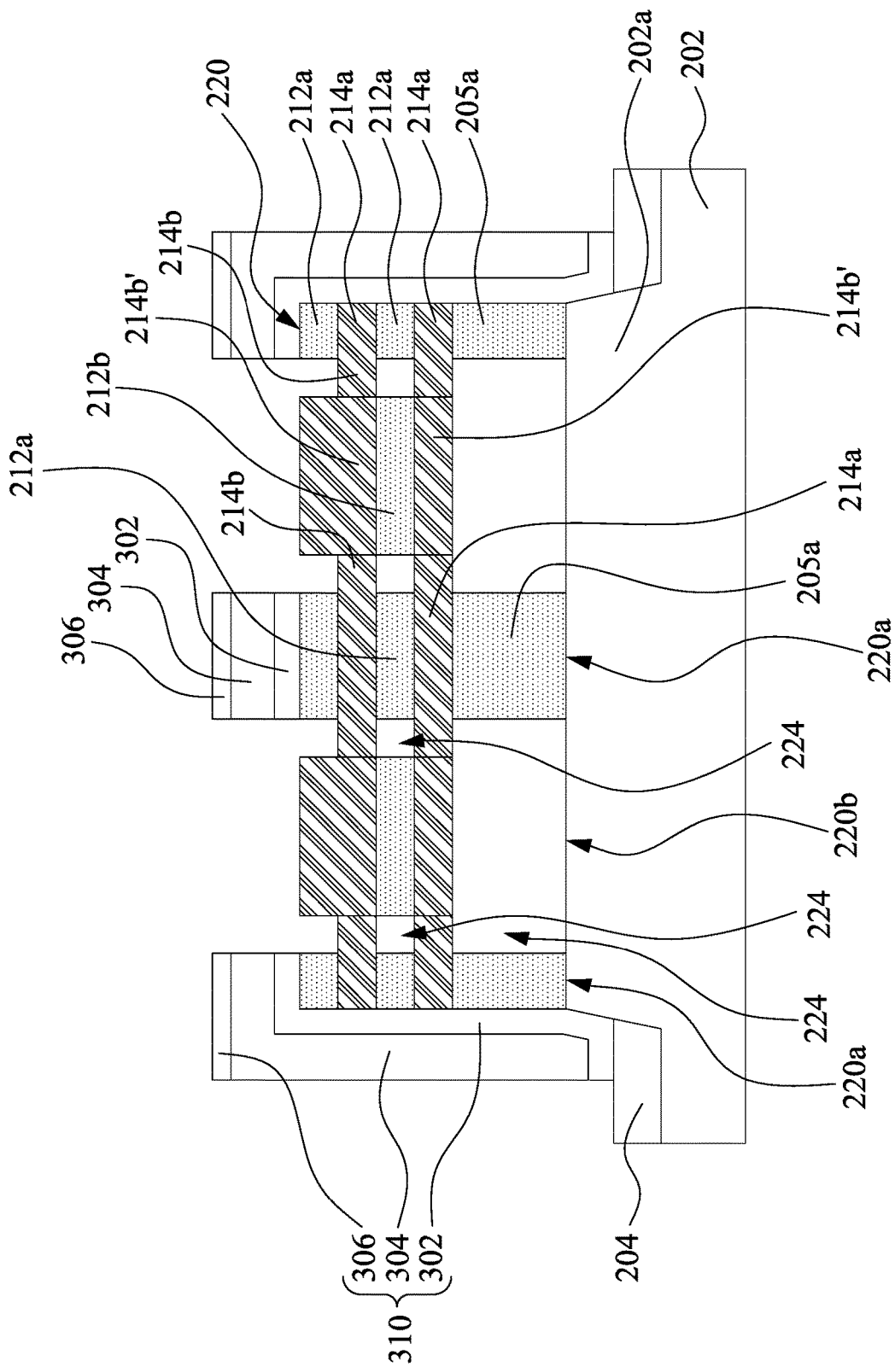
Figure 10C:
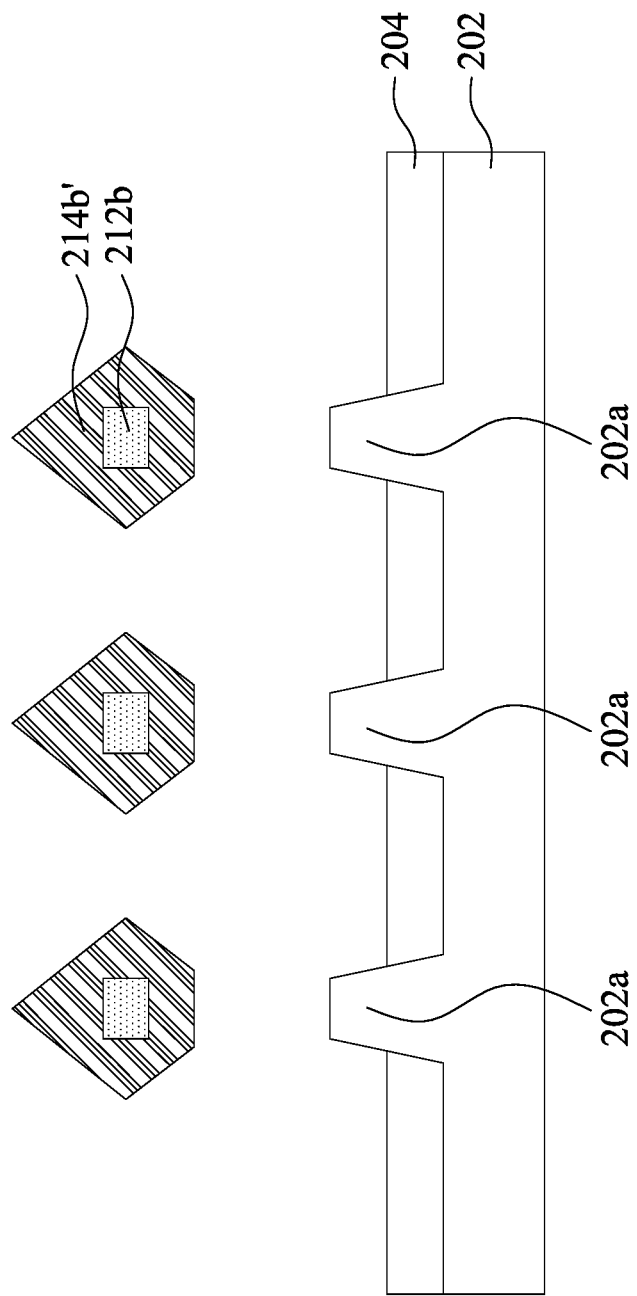

Reference is made to FIGS. 10A-10C. FIG. 10A is a top view of the structure 100. FIGS. 1B and 1C are cross-sectional views taken along sections B-B and C-C in FIG. 10A respectively. After the removing of the first spacer portions 312a and the second spacer portions 312b, removing the second bottom sacrificial portions 205b of the bottom sacrificial layer 205 and portions of the second sacrificial portions 212b without being surrounded by the epitaxy structures 214b'. In other words, the etching process removes the second bottom sacrificial portions 205b of the bottom sacrificial layer 205 between the lowest most second nanowire portions 214b and the semiconductor substrate 202, removes the second sacrificial portions 212b between the second nanowire portions 214b outside the epitaxy structures 214b', and removes the second sacrificial portions 212b farthest away from the semiconductor substrate 202.

That is, the bottom sacrificial layer 205 and the second sacrificial portions 212b in the regions not protected by the dummy gate structures 310 and the epitaxy structures 214b' are removed, leaving gaps 224 as shown in FIG. 10B. The gaps 224 are formed between the lowest most second nanowire portions 214*b* and the semiconductor substrate 202, and between the second nanowire portions 214*b* outside the epitaxy structures 214*b*'. In some embodiments, an anisotropic etching process may be used to selectively remove the portions of the second sacrificial portions 212*b*. Then, after the removing of the portions of the second sacrificial portions 212*b* and the second bottom sacrificial portions 205*b* of the bottom sacrificial layers 205, the second nanowire portions 214*b* of the nanowires 214 and the epitaxy structures 214*b*' are released from the fins 220.

Figure 11A:
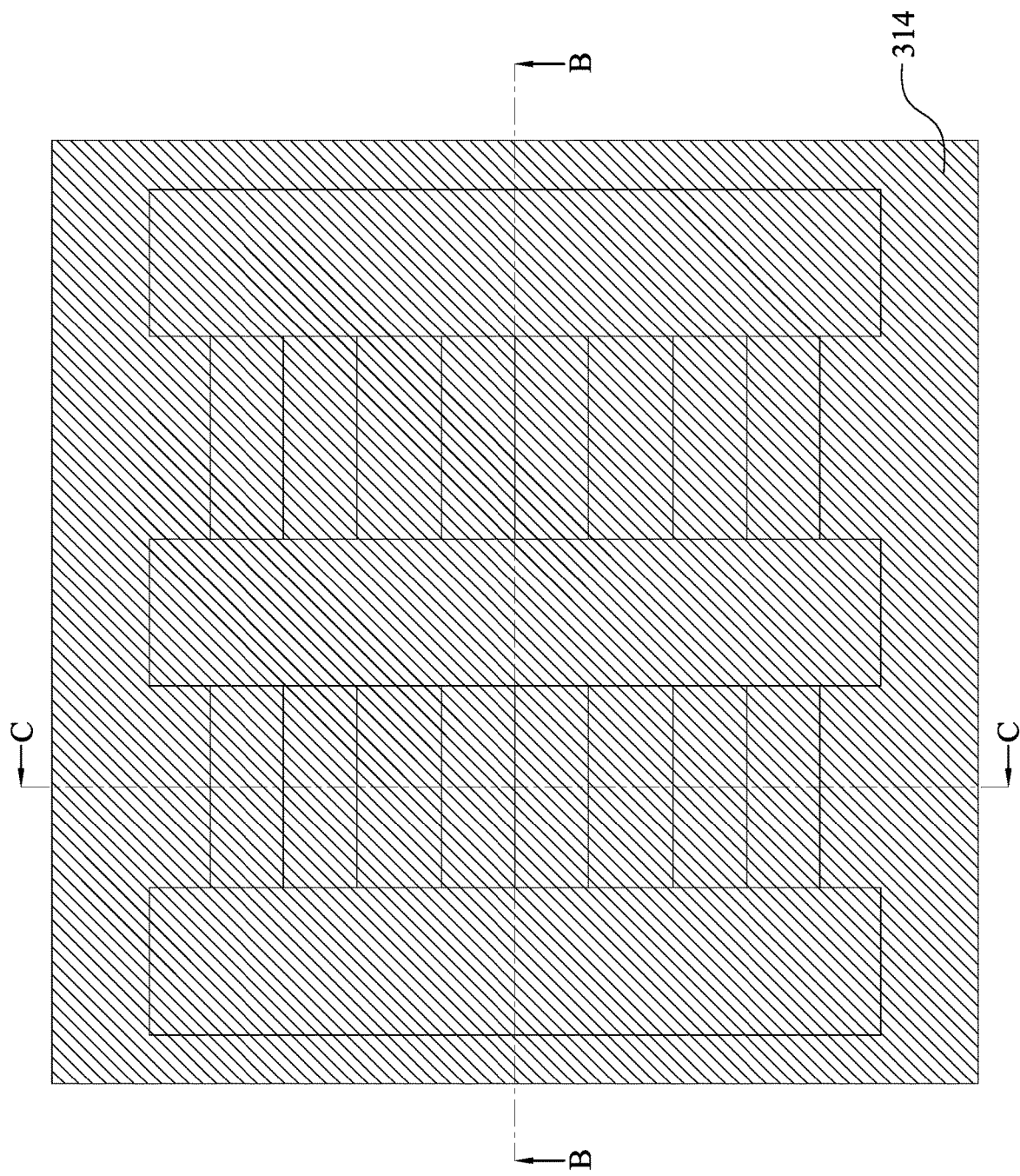
Figure 11B:
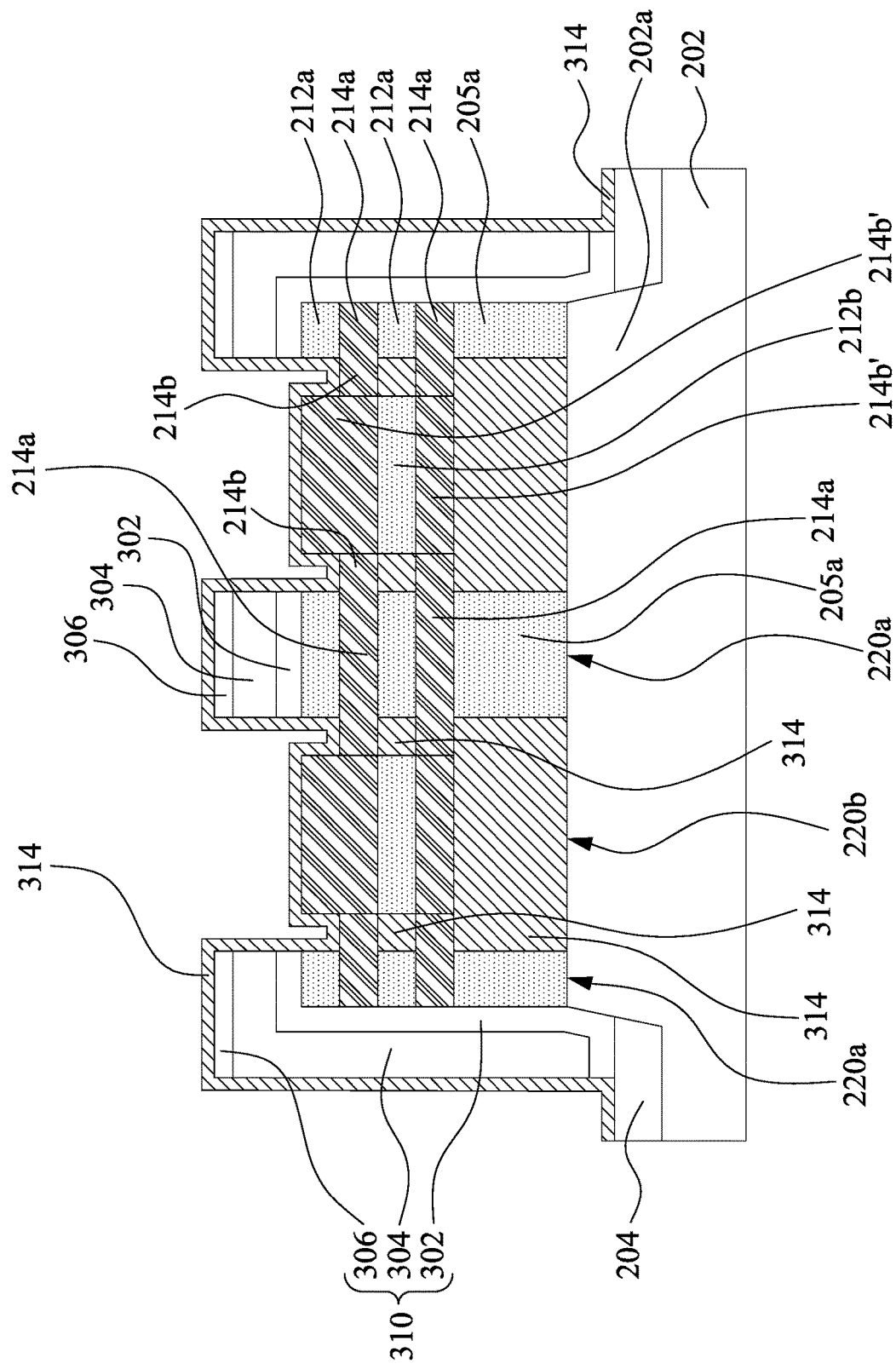
Figure 11C:
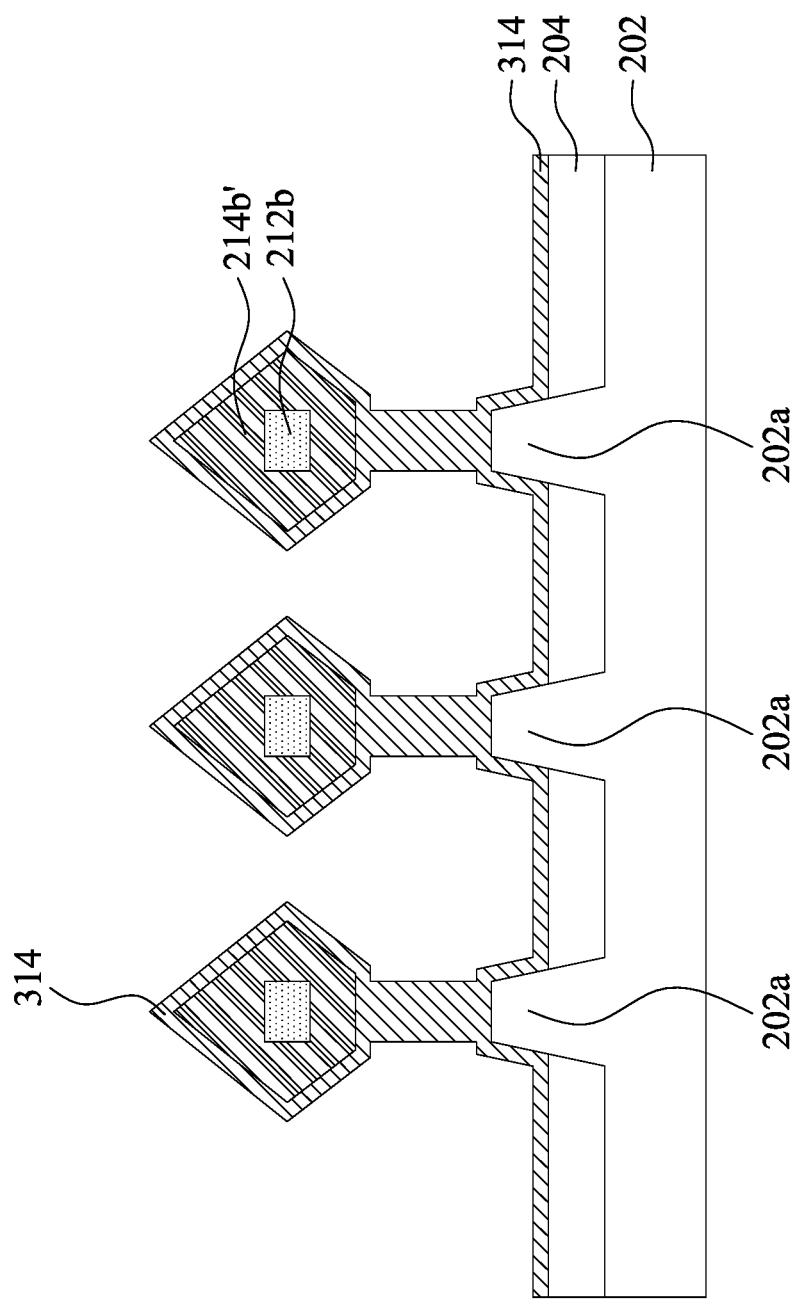

Reference is made to FIGS. 11A-11C. FIG. 11A is a top view of the structure 100. FIGS. 11B and 11C are cross-sectional views taken along sections B-B and C-C in FIG. 11A respectively. After the removing the portions of the second sacrificial portions 212*b* and the second bottom sacrificial portions 205*b* of the bottom sacrificial layers 205, a gate spacer 314 (may be also referred to as an interlayer dielectric layer) is at least formed on sidewalls of the dummy gate structures 310 and in the gaps 224. The gate spacer 314 is disposed on and in contact with sidewalls of the dummy gate structures 310 and extends into a space (i.e., the gap 224 as shown in FIG. 10B) between the epitaxy structure 214*b*' and the semiconductor substrate 202. In some embodiments, the gate spacer 314 is deposited as a blanket layer, and is conformal formed over the semiconductor substrate 202.

In some embodiments, the gate spacer 314 extends into a space (i.e., the gap 224 as shown in FIG. 10B) between the epitaxy structure 214*b*' and the semiconductor substrate 202. That is, the gate spacer 314 is at least partially disposed between the epitaxy structures 214*b*' and further disposed between the lowest most second nanowire portions 214*b* and the semiconductor substrate 202. In some embodiments, the gate spacer 314 further covers the epitaxy structure 214*b*' and the second nanowire portions 214*b* of the nanowires 214. In some embodiments, the gate spacer 314 is further disposed between adjacent two of the nanowires 214, and between the second sacrificial portions 212*b* wrapped in the epitaxy structures 214*b*' and the dummy gate structure 310. In other words, the gate spacer 314 separates the second sacrificial portions 212*b* wrapped in the epitaxy structures 214*b*' and the dummy gate structures 310.

The gate spacer 314 is made of a material, such as, oxide or nitride, and the instant disclosure is not limited thereto. In some embodiments, the gate spacer 314 may be the same material as the dummy spacer 312 shown in FIGS. 5A-5C. The gate spacer 314 can be formed utilizing a deposition process such as, a spin-on process, a chemical vapor deposition (CVD) process, a plasma enhanced chemical vapor deposition (PECVD) process, evaporation process, chemical solution deposition process and other like deposition techniques.

The disclosure present herein starts from multilayer, such as, Si/SiGe, and can apply a standard Finfet (Fin field effect transistor) process. With such configuration, a device can be manufactured without using a silicon on insulator (SOI) wafer. The epitaxy structures 214*b*' are isolated from the semiconductor substrate 202 by the gate spacer 314. The gate spacer 314 will isolate the source/drain from the semiconductor substrate 202, thereby removing the source/drain bulk leakage, such that the device performance can be improved.

Figure 12A:
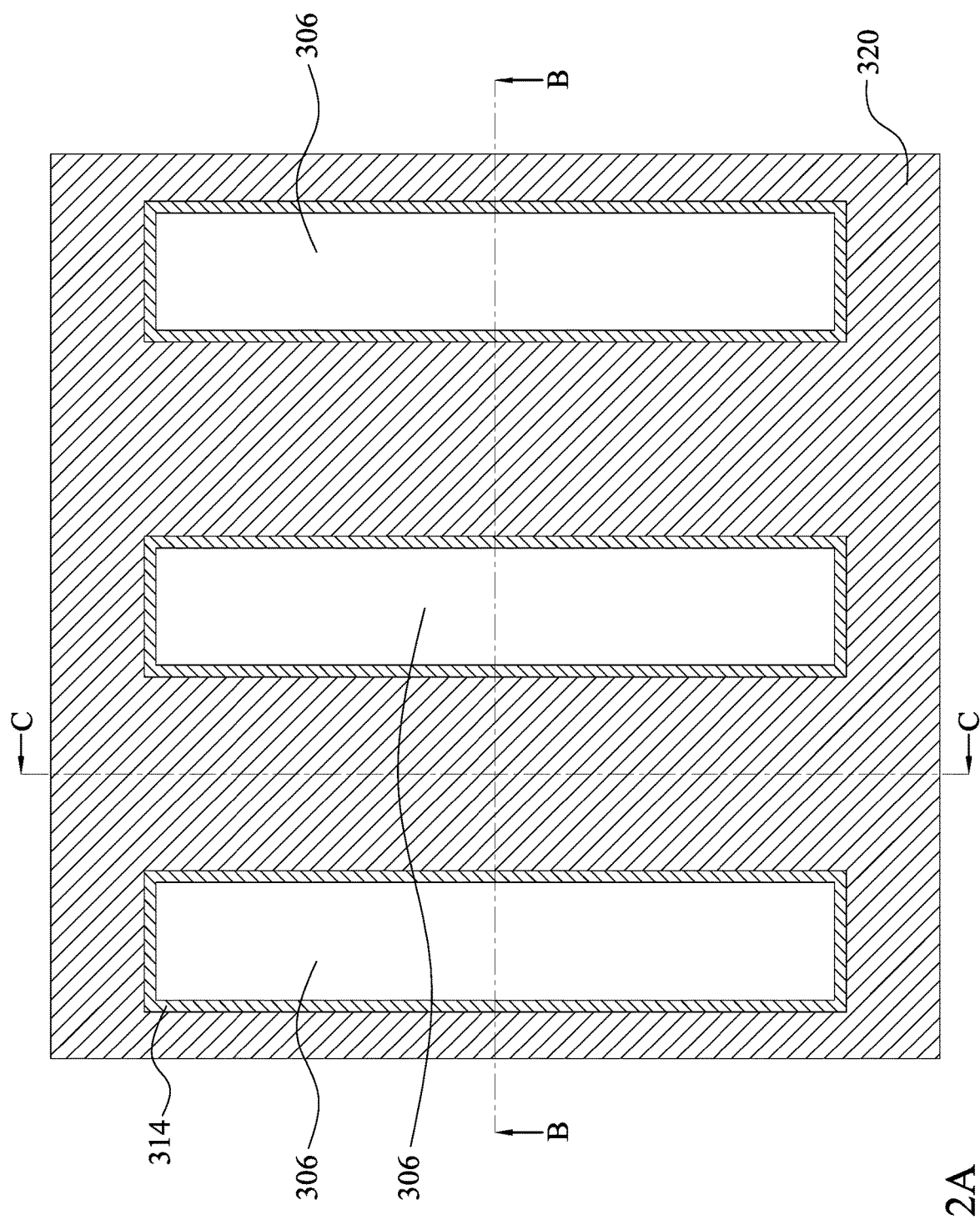
Figure 12B:
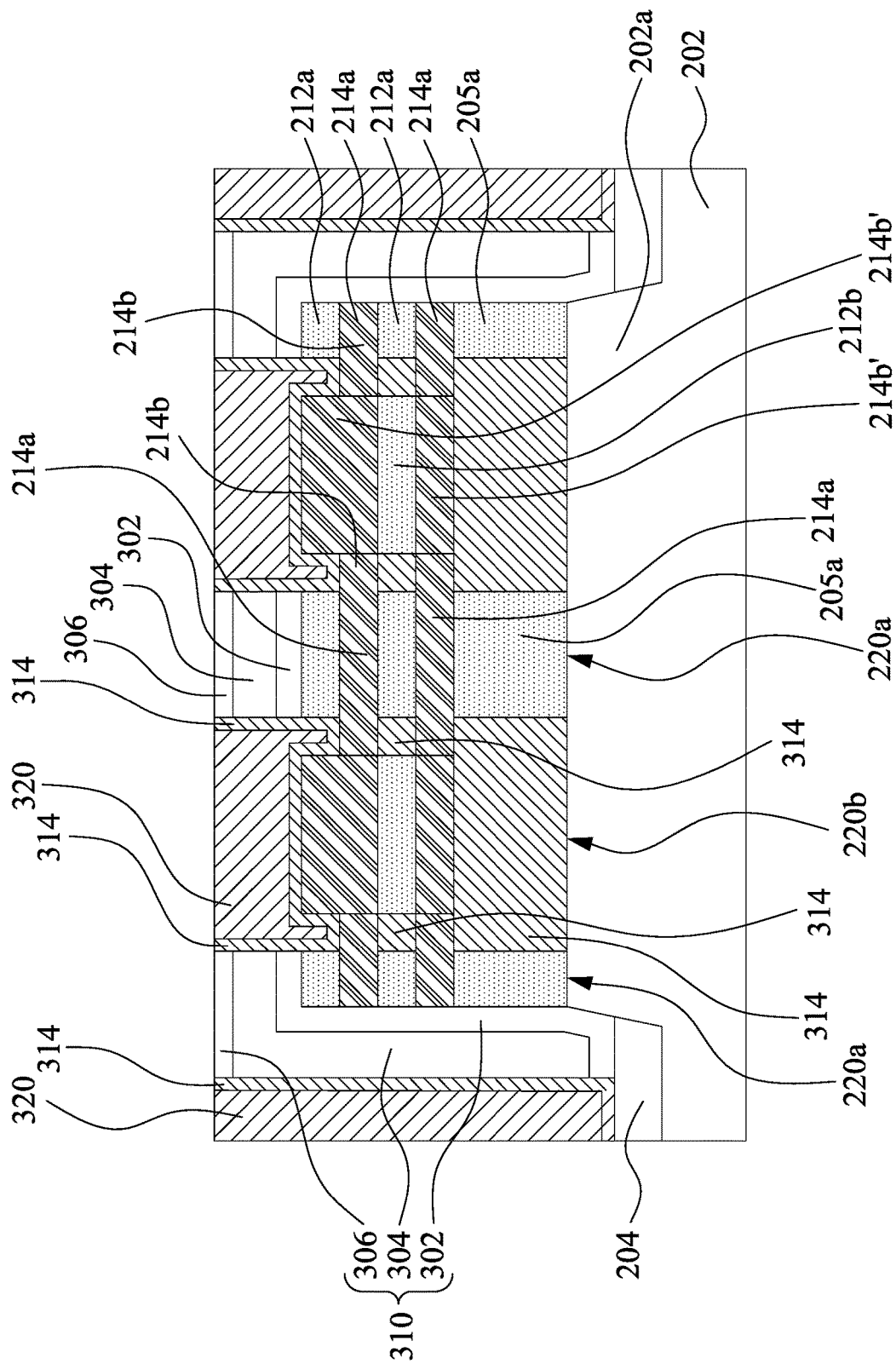
Figure 12C:
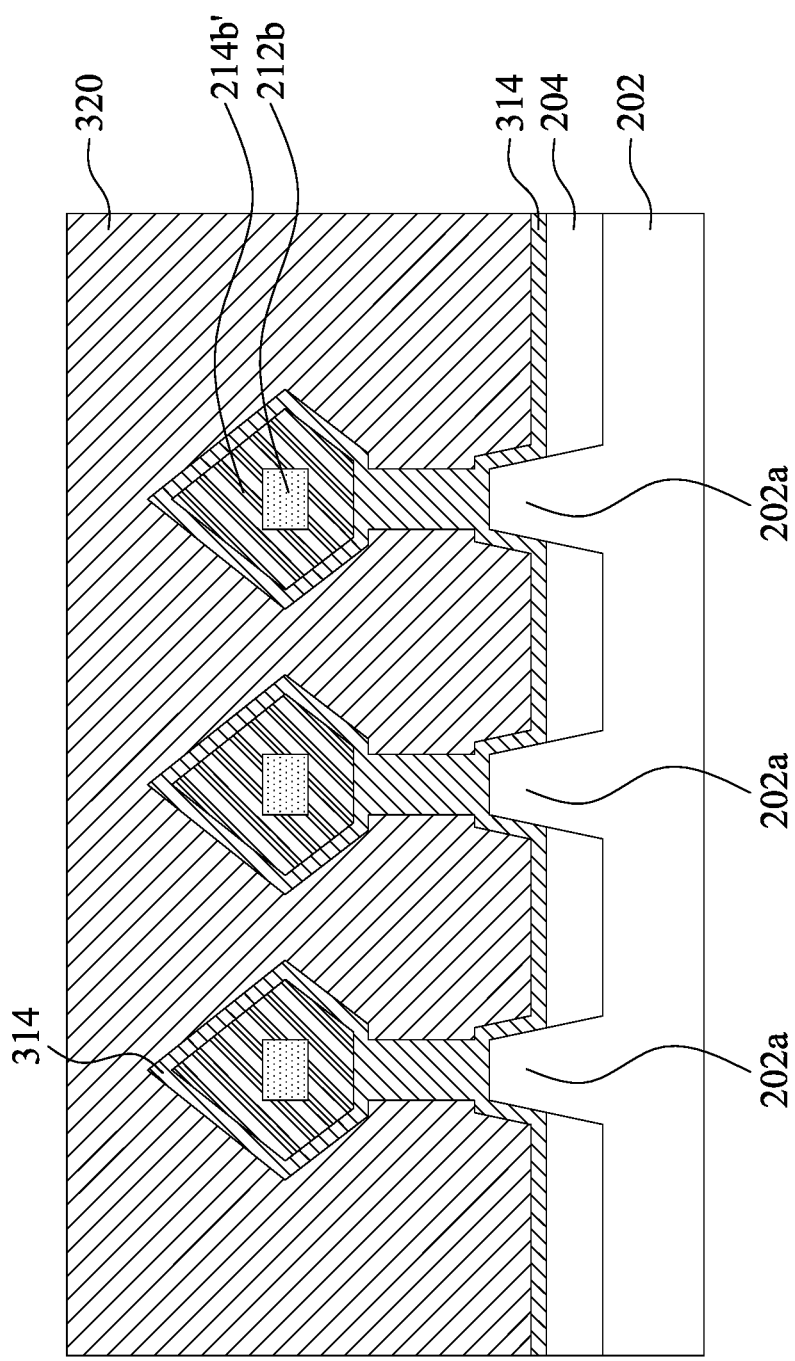

Reference is made to FIGS. 12A-12C. FIG. 12A is a top view of the structure 100. FIGS. 12B and 12C are cross-sectional views taken along sections B-B and C-C in FIG. 12A respectively. An interlayer dielectric (ILD) layer 320 is blanket deposited on the semiconductor substrate 202, disposed in the spaces left between portions of the gate spacer 314. Further, the interlayer dielectric layer 320 covers up the gate spacer 314 and the dummy gate structures 310.

Then, a planarization process is performed to the interlayer dielectric layer 320. The planarization process may be a chemical mechanical polishing (CMP) process or any other suitable process. Portions of the interlayer dielectric layer 320 are removed. The interlayer dielectric layer 320 between the portions of the gate spacer 314 remains. On top of the epitaxy structures 214*b*', a layer of the interlayer dielectric layer 320 remains.

Figure 13A:
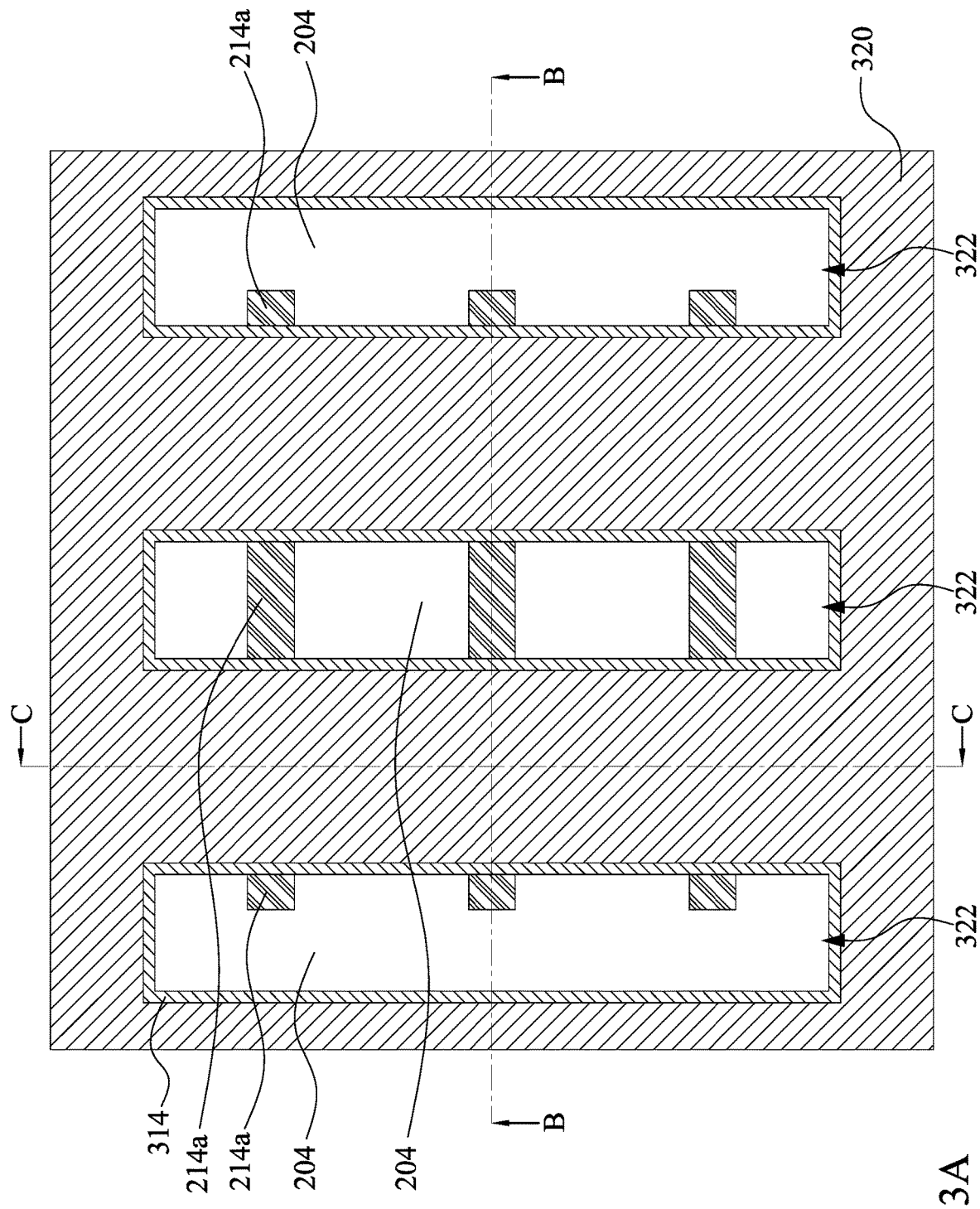
Figure 13B:
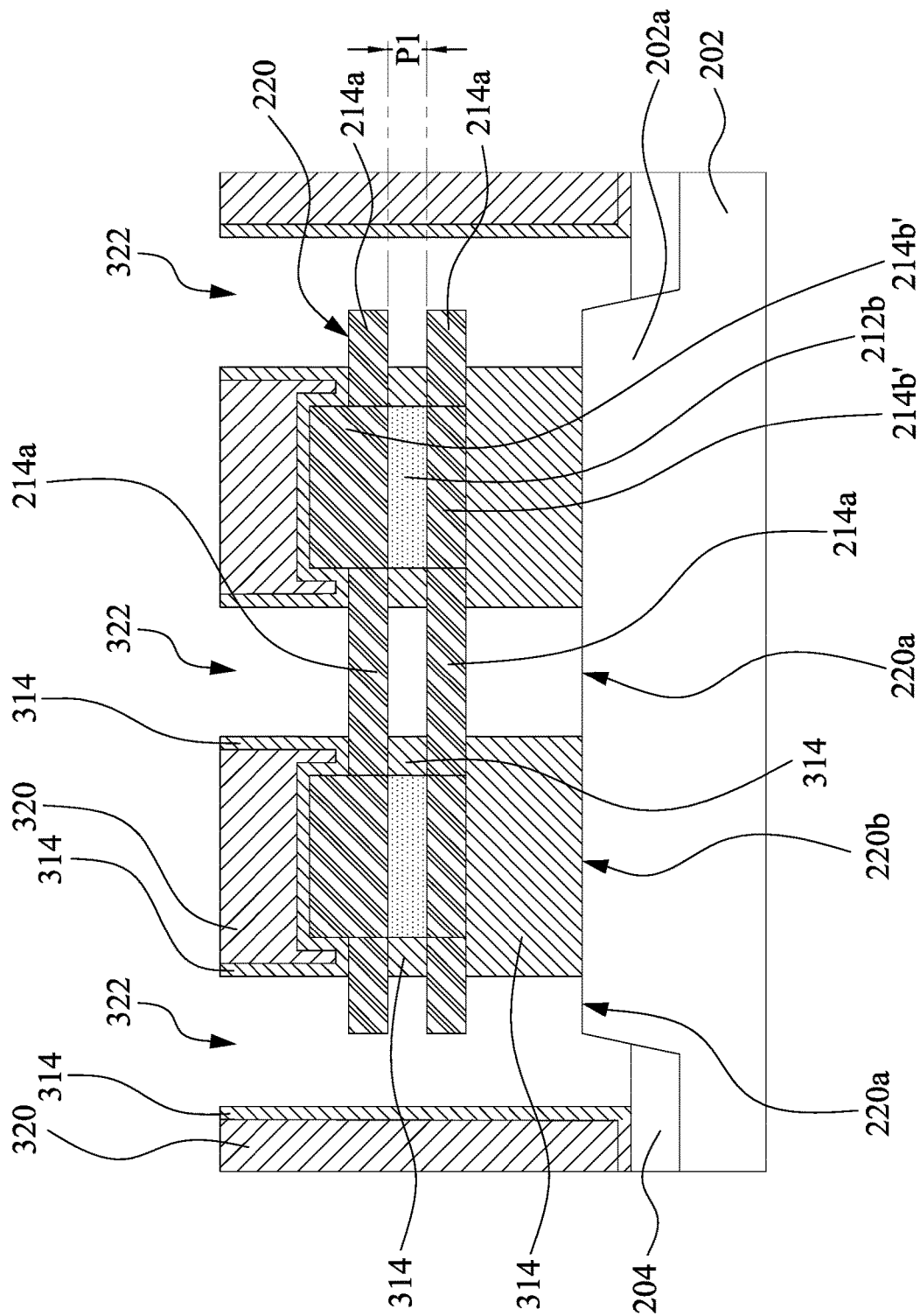
Figure 13C:
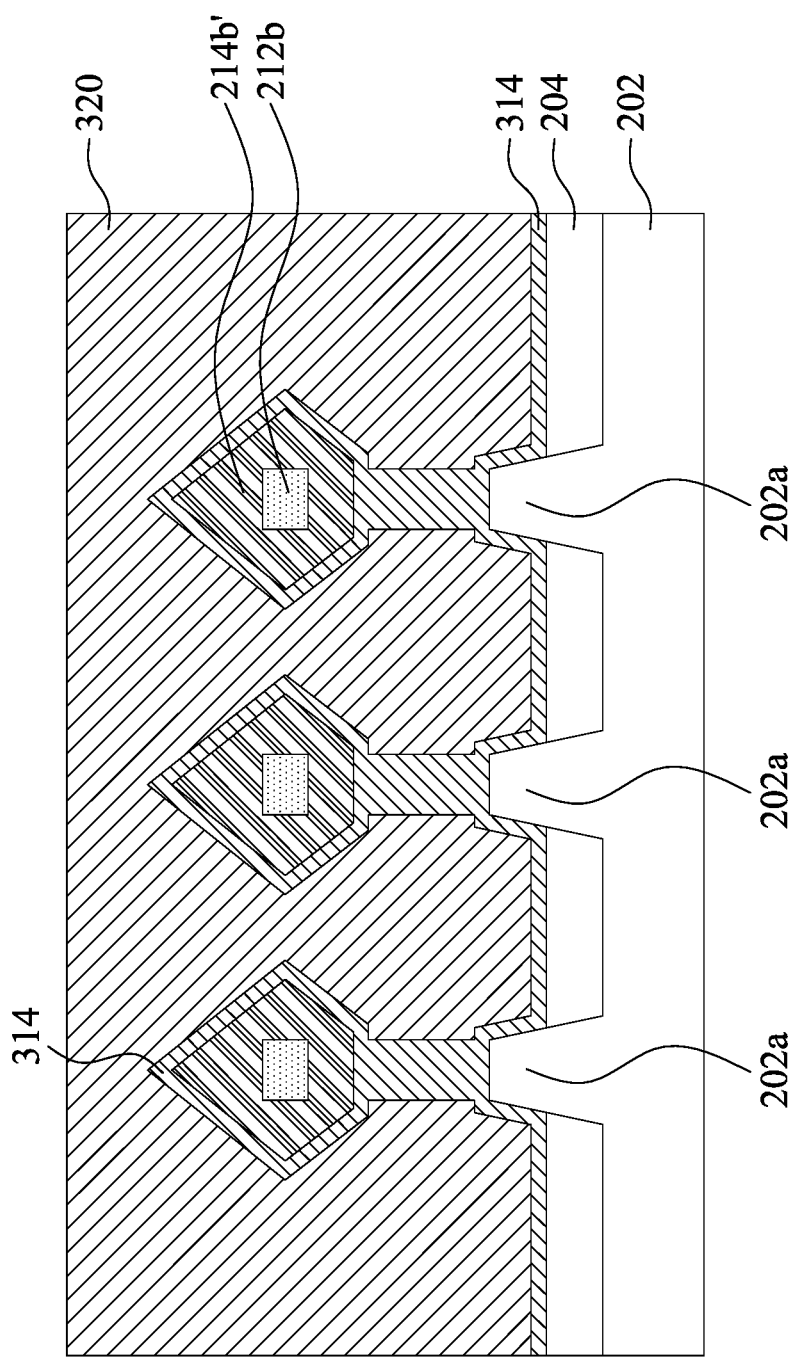

Reference is made to FIGS. 13A-13C. FIG. 13A is a top view of the structure 100. FIGS. 13B and 13C are cross-sectional views taken along sections B-B and C-C in FIG. 13A respectively. After planarization, the dummy gate structures 310 and the first sacrificial portions 212*a* of the sacrificial layers 212 (shown in FIGS. 11B and 11C) are removed to form gate trenches 322, but the gate spacer 314 and the first nanowire portions 214*a* of the nanowires 214 remain. The dummy gate electrode layer 304 and the gate dielectric layer 302 are removed by any suitable process, leaving spaces between the first spacer portions 312*a*. The channel regions 220*a* of the fins 220 are then exposed from the gate trenches 322, while the epitaxy structures 214*b*' are still under the coverage of the interlayer dielectric layer 320.

Then, after removal of the dummy gate structures 310, the first sacrificial portions 212*a* (shown in FIGS. 11B and 11C) of the sacrificial layers 212 are removed. As shown in FIG. 13A, the first sacrificial portions 212*a* of the top sacrificial layers 212 and the first bottom sacrificial portions 205*a* of the bottom sacrificial portion 205 in the channel regions 202*a* are removed, leaving the underlying first nanowire portions 214*a* of the nanowires 214 exposed. The first sacrificial portions 212*a* of the sacrificial layers 212 between the nanowires 214 are also removed. The first nanowire portions 214*a* of the nanowires 214 are released from the fins 220 and spaced apart from each other. The first nanowire portions 214*a* of the nanowires 214 are not flanked by the sacrificial layer 212 anymore.

After the removal of the first sacrificial portions 212*a* of the sacrificial layers 212, spaces are left between the nanowires 214. The pitch P1 between the nanowires 214 are determined by the thickness of the sacrificial layer 212 shown in FIGS. 11B and 11C. The first nanowire portions 214*a* of the nanowires 214 suspend over one another without making contact. The pitch P1 between the nanowires 214 reflects where the first sacrificial portions 212*a* of the sacrificial layers 212 use to stand. For example, if the sacrificial layer 212 has a thickness of about 8 nm, after the removal of the first sacrificial portions 212*a* of the sacrificial layers 212, the pitch P1 is measured of about 8 nm. The pitch P1 has pivotal effect in the nanowire 214 configuration at the channel regions 220*a*.

Figure 14A:
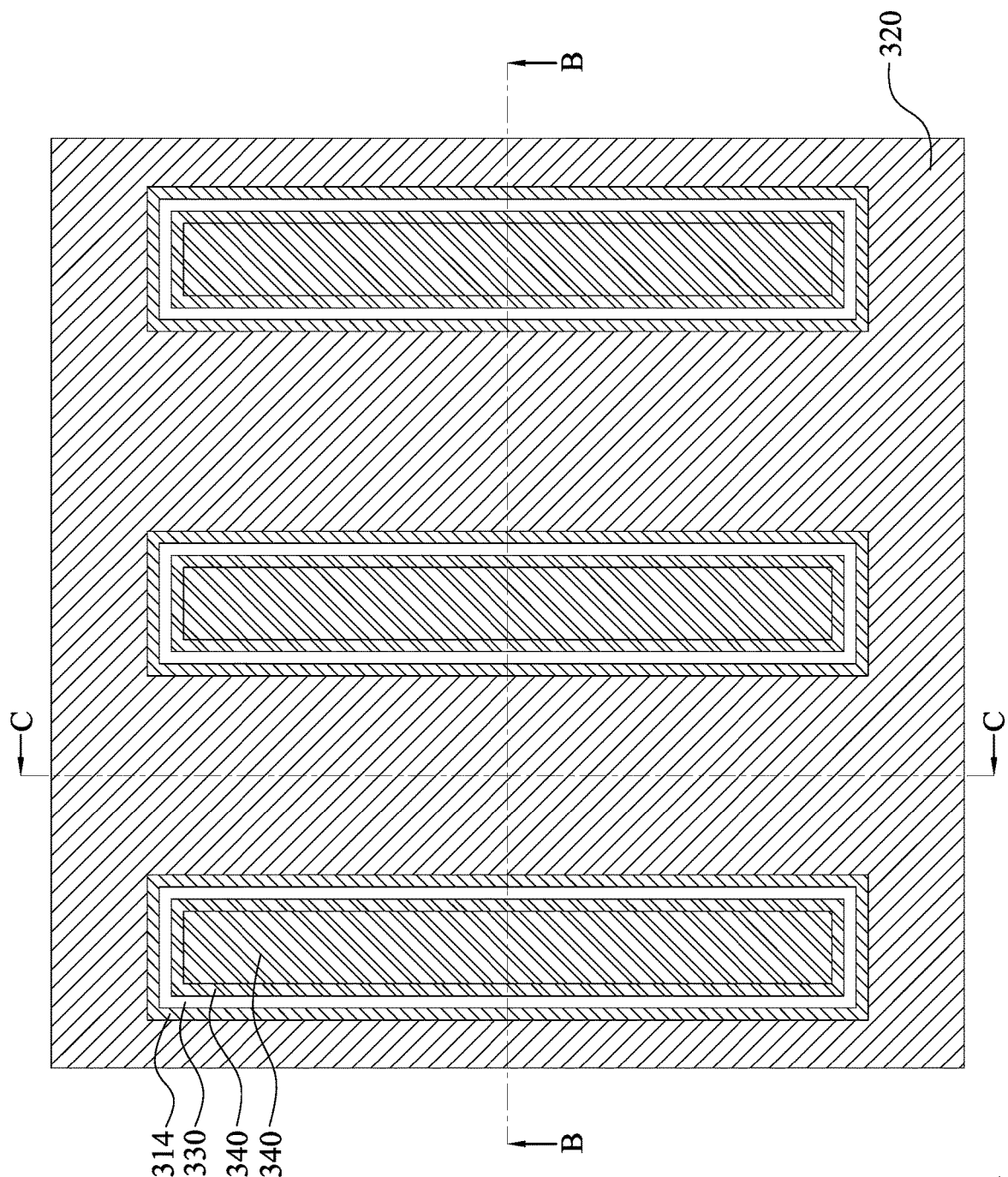
Figure 14B:
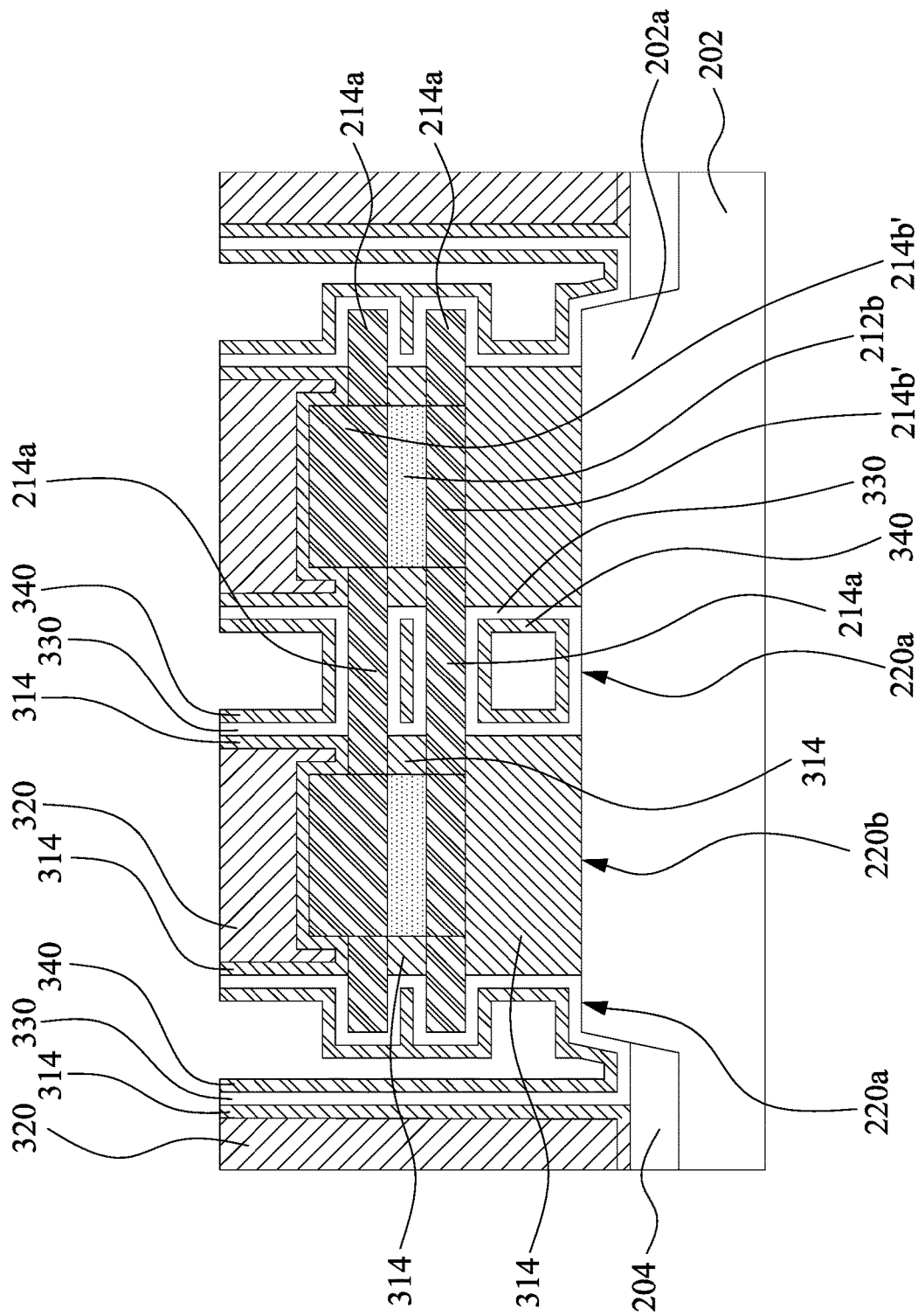
Figure 14C:
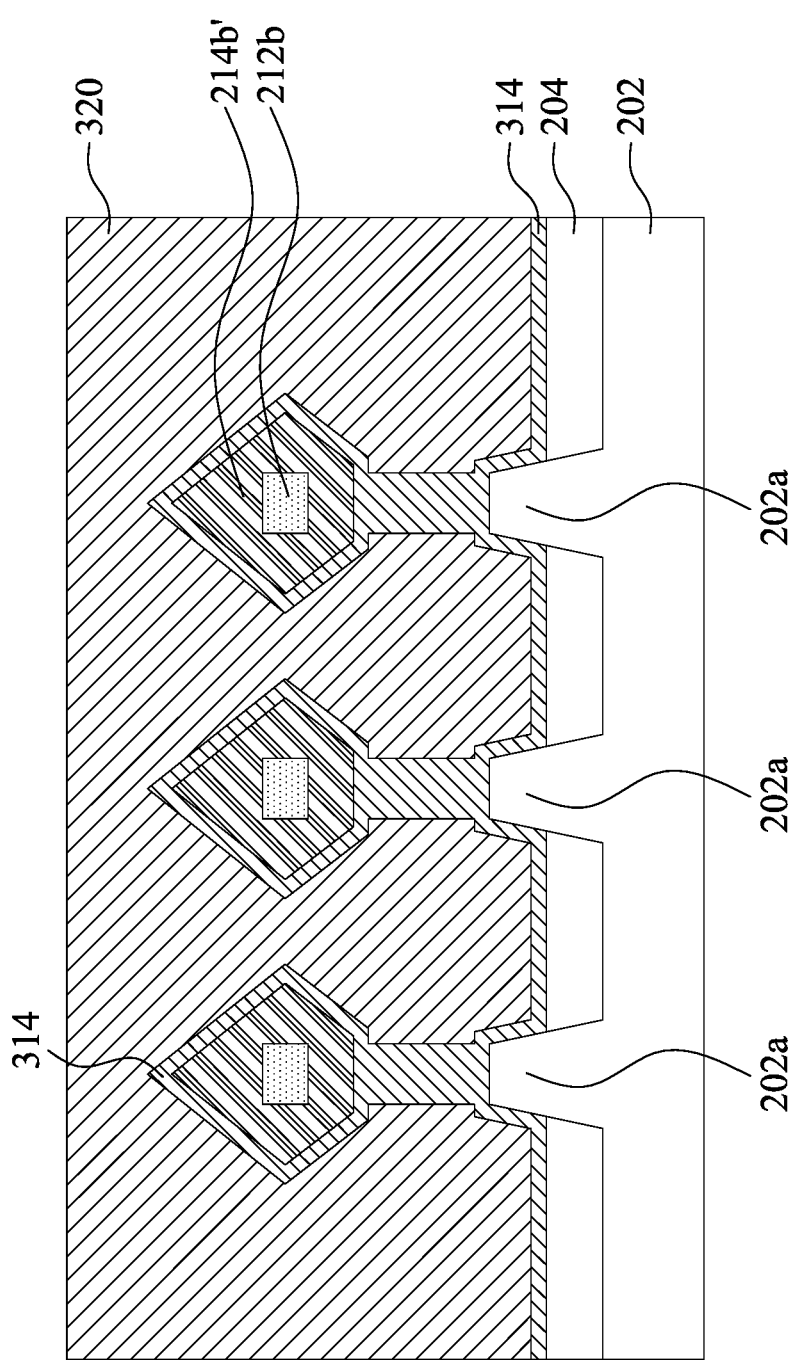

Reference is made to FIGS. 14A-14C. FIG. 14A is a top view of the structure 100. FIGS. 14B and 14C are cross-sectional views taken along sections B-B and C-C in FIG. 14A respectively. A high-k dielectric layer 330 (can also referred to as an interlayer dielectric layer) and a work function metal layer 340 are formed on the first nanowire portions 214*a* of the nanowires 214 and in the gate trench 322. As shown in FIG. 13B, the high-k dielectric layer 330 is a thin layer formed on the exposed surfaces including the sidewalls of the first spacer portions 312*a* and first nanowire portions 214*a* of the nanowires 214. Specifically, the high-k dielectric layer 330 is in contact with the gate spacer 314 and covers the first nanowire portions 214*a* of the nanowires 214. As shown in FIG. 13C, the high-k dielectric layer 330 wraps around the first nanowire portions 214a of the nanowires 214. The surface of the isolation structures 204 and the protruded portions 202a of the semiconductor substrate 202 are also covered by the high-k dielectric layer 330. Spaces between the first nanowire portions 214a of the nanowires 214 are still left after the deposition of the high-k dielectric layer 330. The high-k dielectric layer 330 includes a material such as hafnium oxide ($HfO_2$), zirconium oxide ($ZrO_7$) or lanthanum oxide ($La_2O_3$). The high-k dielectric layer 330 may be formed by suitable deposition processes, for example, chemical vapor deposition (CVD), plasma enhanced chemical vapor deposition (PECVD), atomic layer deposition (ALD), evaporation, physical vapor deposition (PVD), chemical solution deposition, or other like processes. The thickness of the high-k dielectric layer 330 may vary depending on the deposition process as well as the composition and number of the high-k dielectric layer 330 used.

Then, a work function metal layer 340 is formed. The work function metal layer 340 may be disposed over the high-k dielectric layer 330, and in the spaces between the nanowires 214a replacing the first sacrificial portions 212a of the sacrificial layers 212. The type of work function metal layer 340 depends on the type of transistor. That is, the work function metal layer 340 may include p-type work function metal materials and n-type work function metal materials. P-type work function materials include compositions such as ruthenium (Ru), palladium (Pd), platinum (Pt), cobalt (Co), nickel (Ni), and conductive metal oxides, or any combination thereof. N-type metal materials include compositions such as hafnium (Hf), zirconium (Zr), titanium (Ti), tantalum (Ta), aluminum (Al), metal carbides (e.g., hafnium carbide (HfC), zirconium carbide (ZrC), titanium carbide (TiC), and aluminum carbide ($Al_4C_3$)), aluminides, or any combination thereof. The work function metal(s) may be deposited by a suitable deposition process, for example, chemical vapor deposition (CVD), plasma-enhanced chemical vapor deposition (PECVD), physical vapor deposition (PVD), plating, thermal or e-beam evaporation, and sputtering. For example, the work function metal layer 340 may include materials such as titanium nitride (TiN) or tantalum nitride (TaN).

Figure 15A:
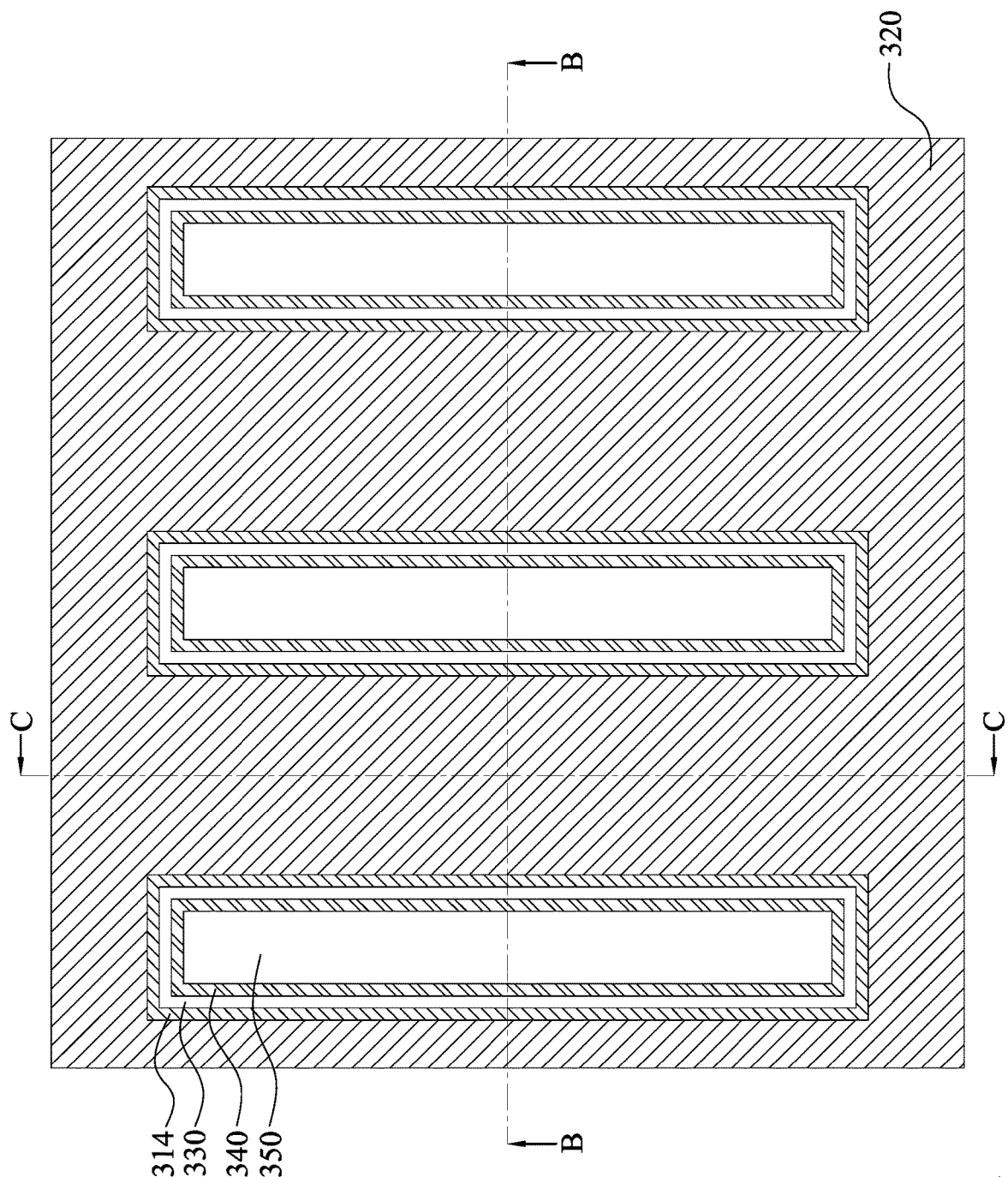
Figure 15B:
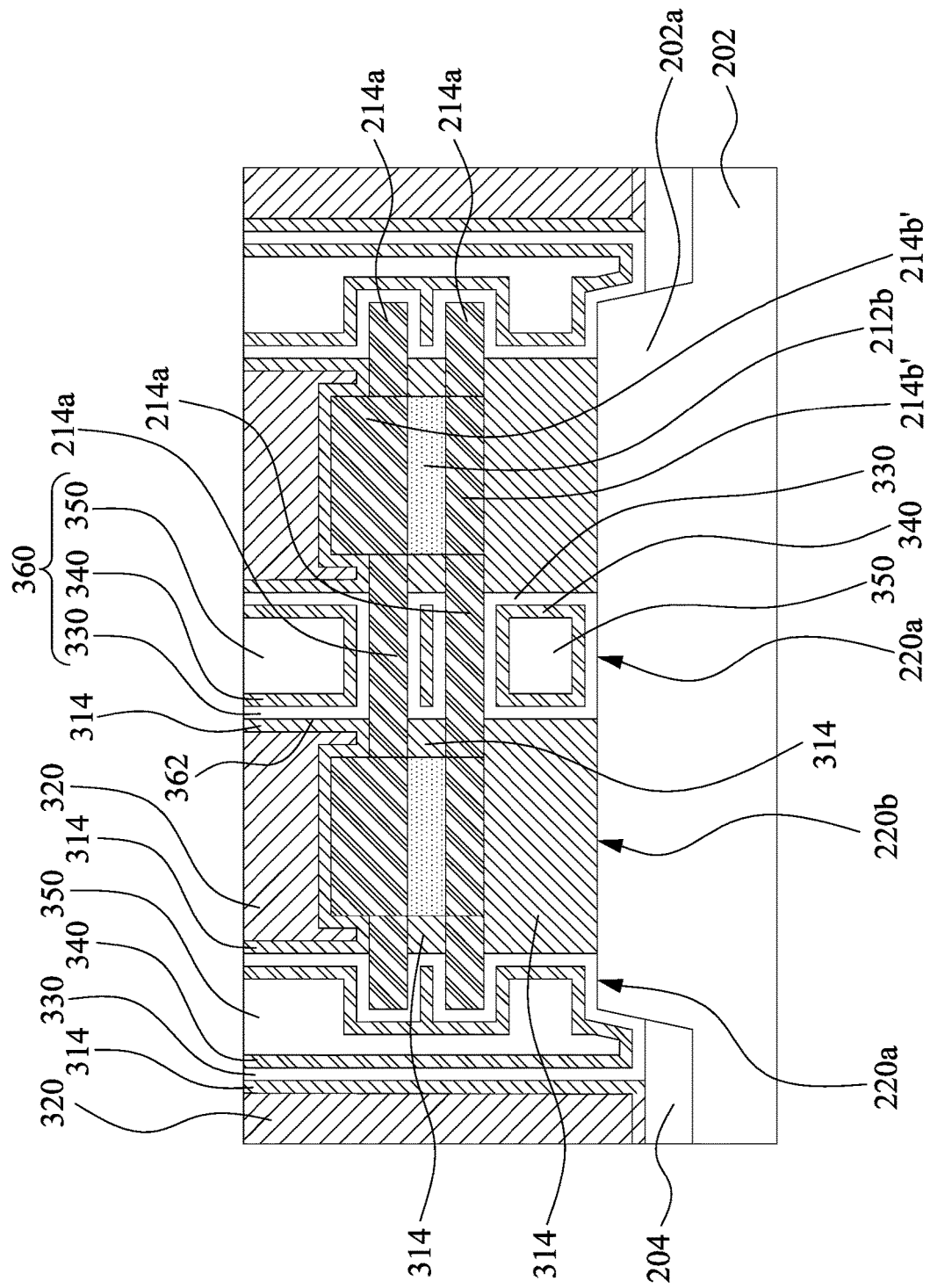
Figure 15C:
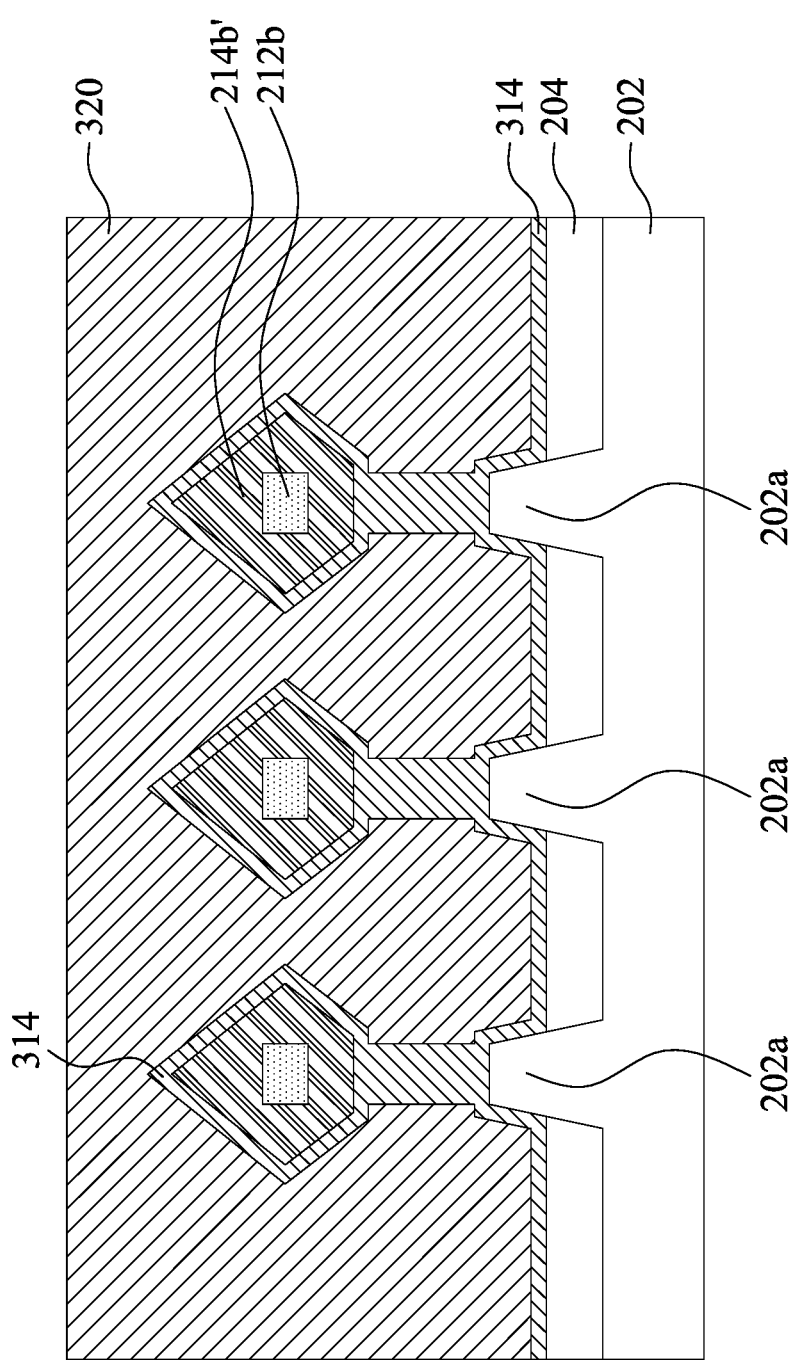

Reference is made to FIGS. 15A-15C. FIG. 15A is a top view of the structure 100. FIGS. 15B and 15C are cross-sectional views taken along sections B-B and C-C in FIG. 15A respectively. Gate electrodes 350 are formed. The gate electrode 350 is deposited over the high-k dielectric layer 330 and the work function metal layer 340 to form the gate structures 360. As shown in FIG. 15C, the gate electrode 350 is disposed in the spaces surrounding the nanowires, thereby wrapping around the first nanowire portions 214a of the nanowires 214. In other words, the first nanowire portions 214a extend through the gate structures 360. The gate spacer 314 is at least disposed on sidewalls 362 of the gate structures 360 and disposed between the second sacrificial portions 212b wrapped in the epitaxy structures 214b' and the dummy gate structure 310. Furthermore, the gate structure 360 is disposed on and in contact with the semiconductor substrate 202. The gate structure 360 replaces the dummy gate structures 310. As such, the gate structures 360 are separated from the second sacrificial portion 212b wrapped in the epitaxy structures 214b' by the gate spacer 314.

The gate electrode 350 may include conductive material, such as, aluminum (Al), platinum (Pt), gold (Au), tungsten (W), titanium (Ti), or any combination thereof. The gate electrode 350 may be deposited by a suitable deposition process, for example, chemical vapor deposition (CVD), plasma-enhanced chemical vapor deposition (PECVD), physical vapor deposition (PVD), plating, thermal or e-beam evaporation, and sputtering. A planarization process, for example, chemical mechanical planarization (CMP), is performed to polish the surface of the conductive gate metal and form the gate stacks.

Figure 16A:
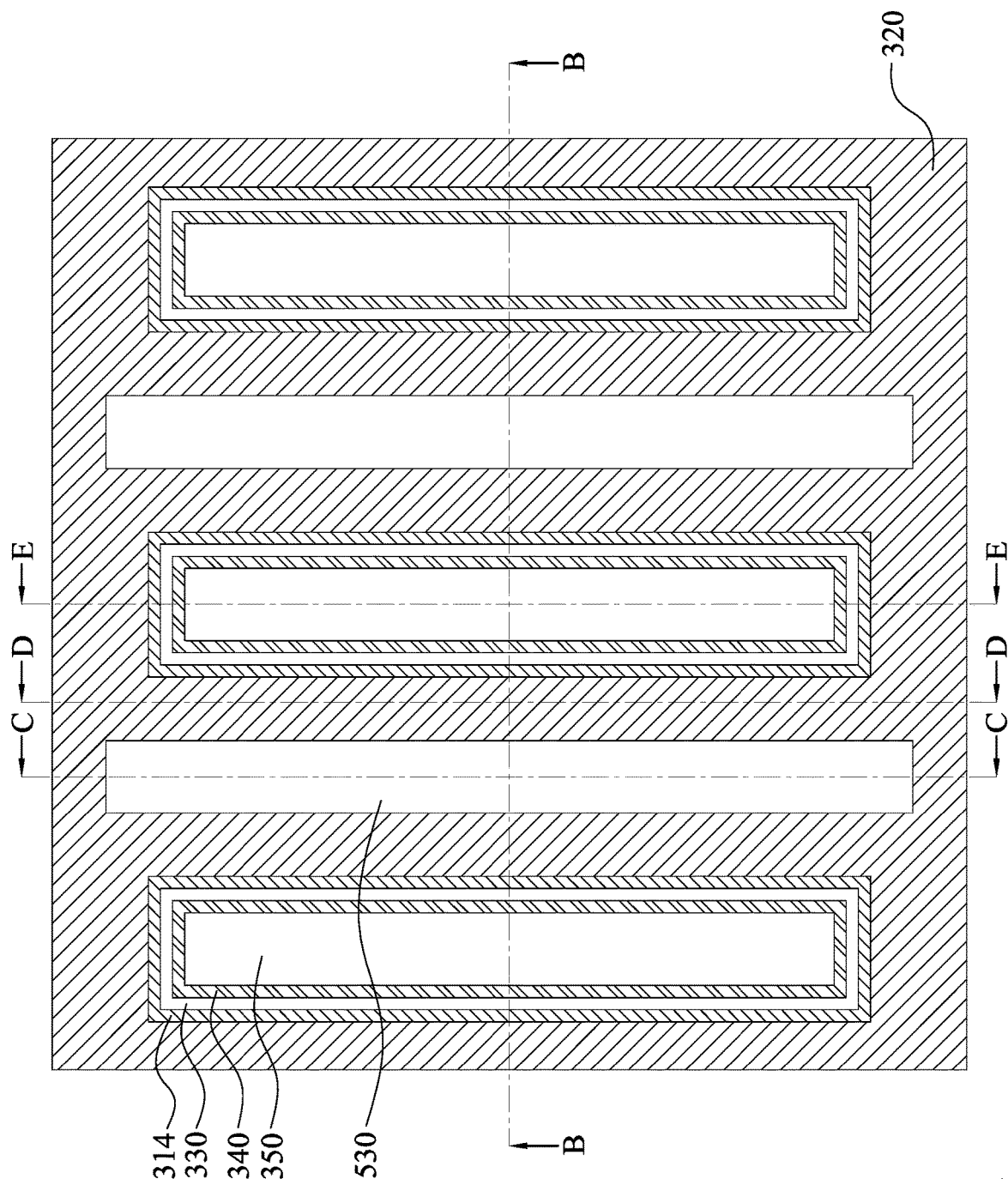
Figure 16B:
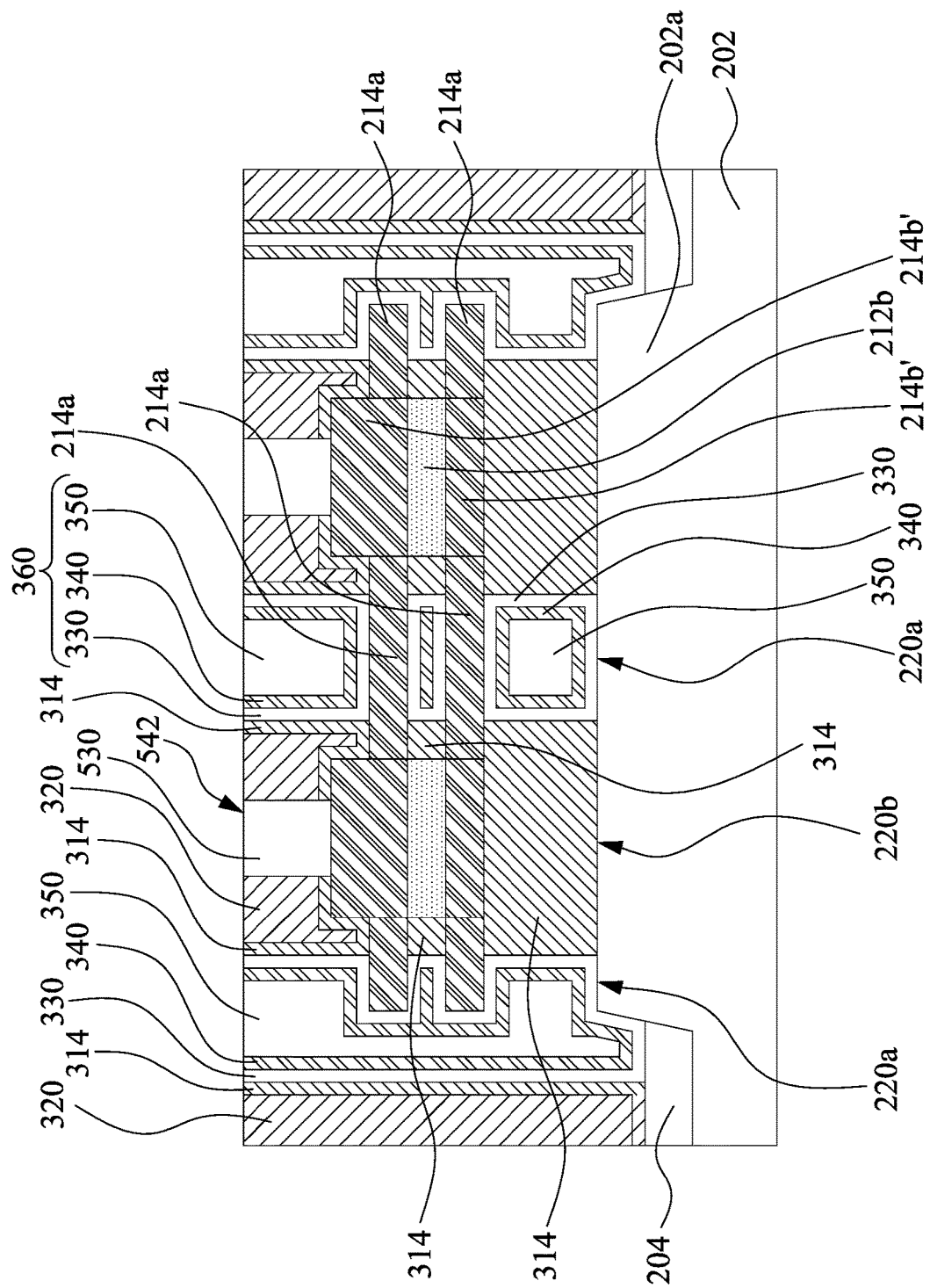
Figure 16C:
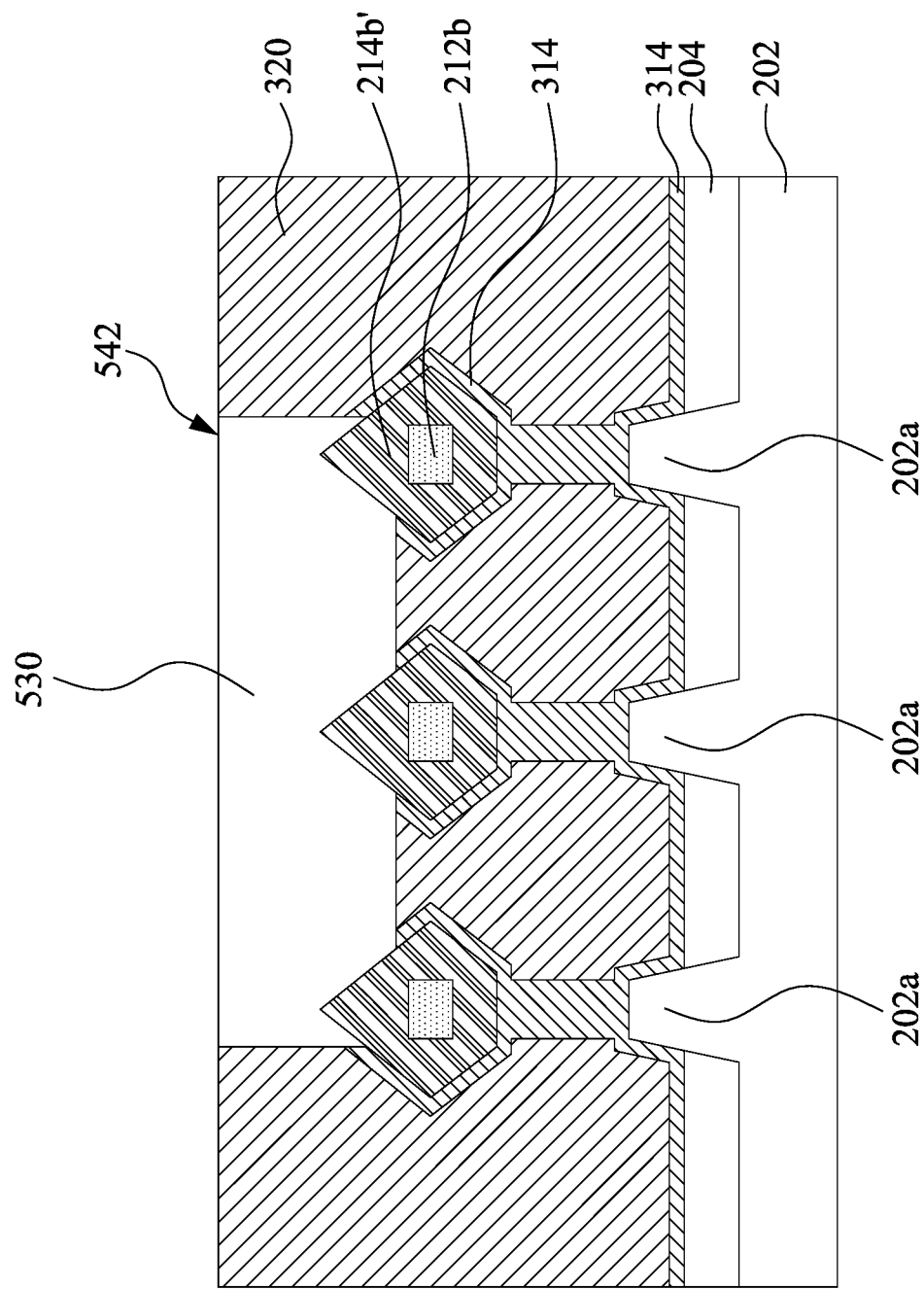
Figure 16D:
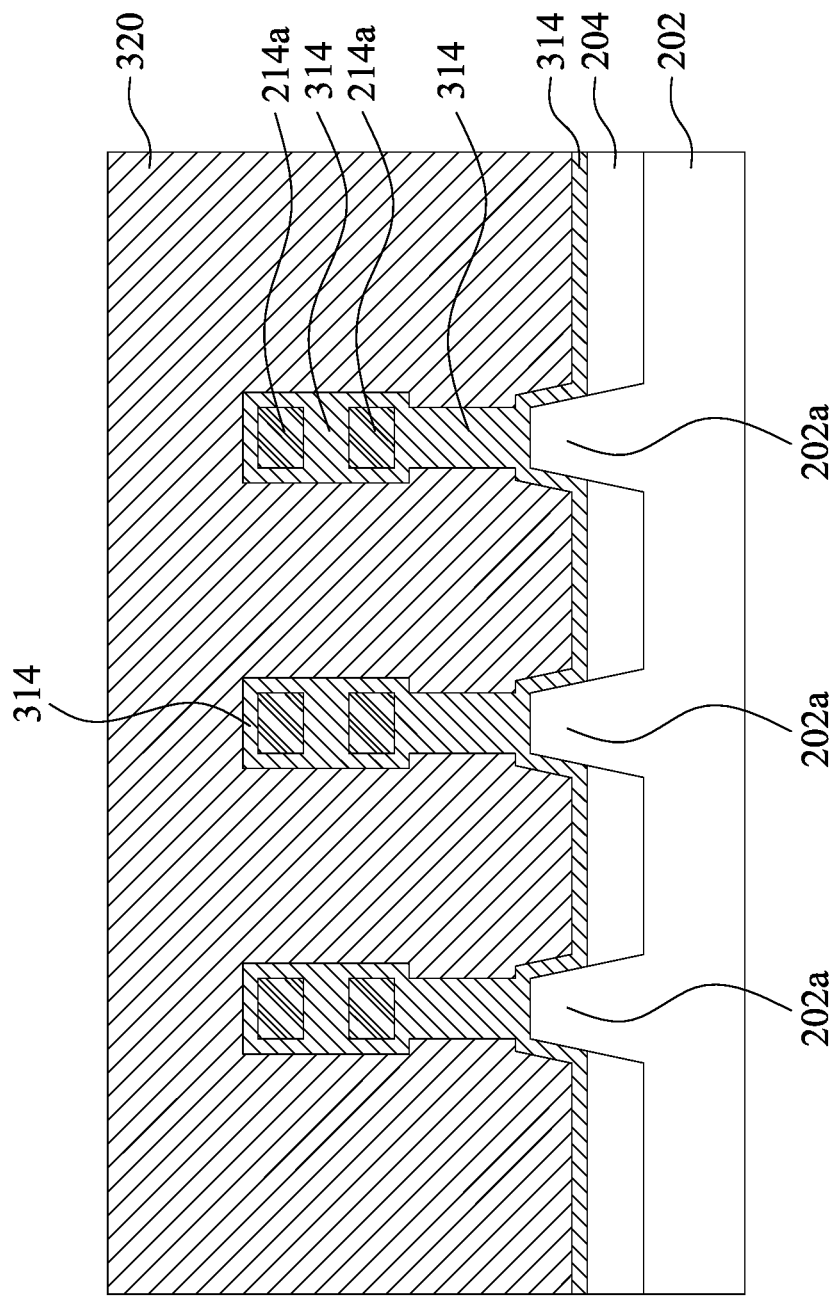
FIGS. 16D and 16E are cross-sectional views along sections D-D and line E-E in FIG. 16A respectively.
Figure 16E:
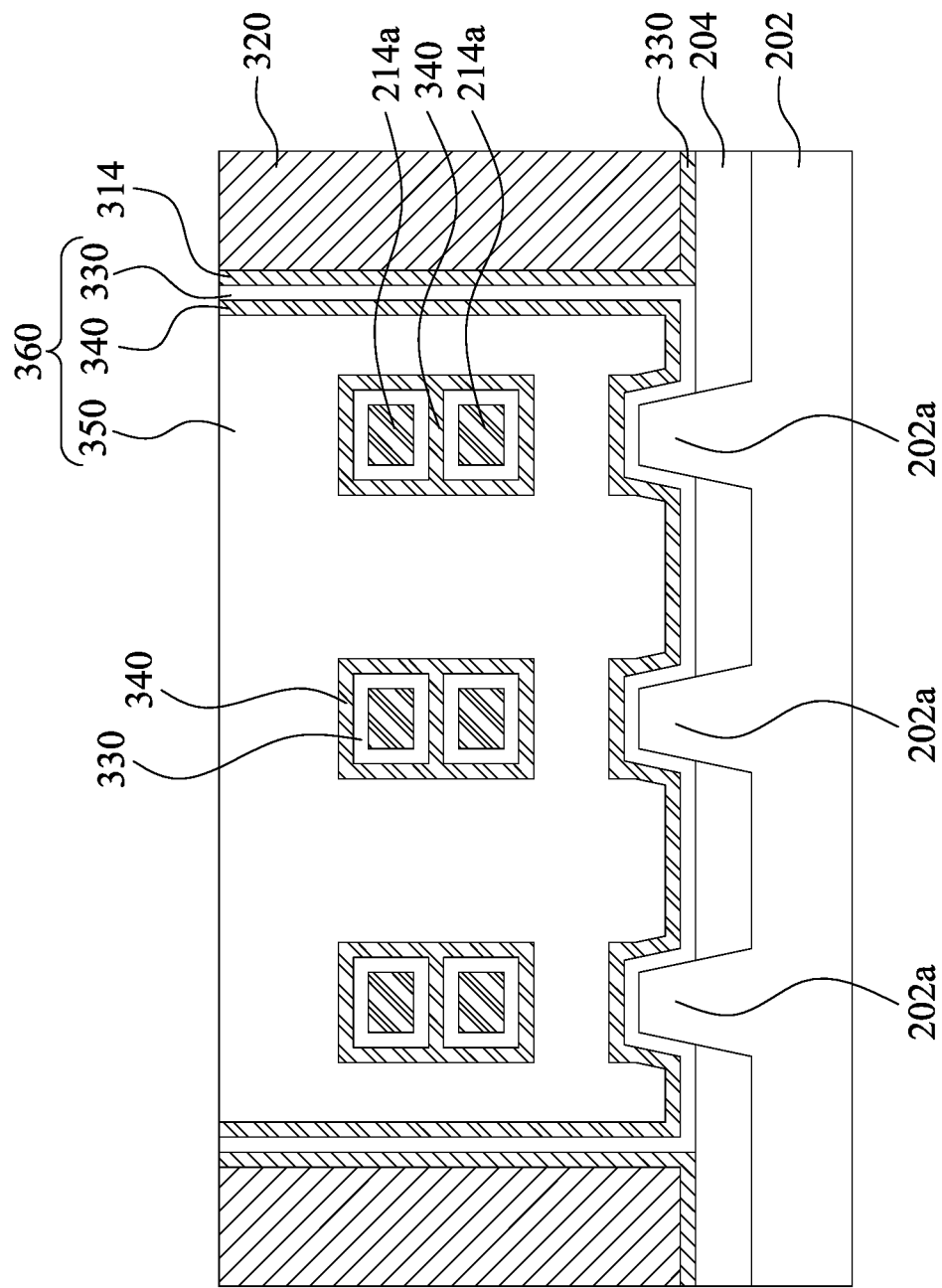

Reference is made to FIGS. 16A-16C. FIG. 16A is a top view of the structure 100. FIGS. 16B and 16C are cross-sectional views taken along sections B-B and C-C in FIG. 16A respectively. A plurality of contact openings 542 are formed in the interlayer dielectric layer 320, and the contact openings 542 respectively expose the epitaxy structures 214'. A plurality of contacts 530 are formed on the epitaxy structures 214b' respectively. Specifically, the contacts 530 are disposed in the contact openings 542 and formed on a top surface of the epitaxy structures 214b'. The interlayer dielectric layer 320 between the gate electrodes 350 are etched downwardly to form the contact openings 542 that expose the epitaxy structures 214b'. The contact openings 542 can be formed by various methods, including a dry etch, a wet etch, or a combination of dry etch and wet etch. During the etching process, portions of the gate spacer 314 below the contact openings 542 as shown in FIGS. 15A-15C are removed accordingly, such that the remained portions of the gate spacer 314 are in contact with surfaces of epitaxy structures 214b' abutting the contact openings 542.

That is, the dielectric layers, i.e., the gate spacer 314 and the interlayer dielectric layer 320, surround the contacts 530. The contacts 530 are connected to the epitaxy structures 150. In some embodiments, metal materials can be filled in the contact openings 542, and the excessive portions of the metal materials are removed by performing a chemical mechanical polishing (CMP) process to form the contacts 530. The contacts 530 are made of a material, such as, tungsten, aluminum, copper, or other suitable materials.

Reference is made to FIGS. 16D and 16E. FIGS. 16D and 16E are cross-sectional views along sections D-D and line E-E in FIG. 16A respectively. The gate spacer 314 is disposed between the first nanowire portions 214a, and further wraps around the first nanowire portions 214a as shown in FIG. 16D. Moreover, the gate electrodes 350 are disposed in the spaces surrounding the first nanowire portions 214a. The gate structures 360 replace the dummy gate structures 310 as shown in FIG. 16E. The gate structures 360 are disposed on the semiconductor substrate 202 and wrapping around the first nanowire portions 214a.

With such configuration, a device can be manufactured without using a silicon on insulator (SOI) wafer. The epitaxy structures 214b' are isolated from the semiconductor substrate 202 by the gate spacer 314. The gate spacer 314 will isolate the source/drain from the semiconductor substrate 202, thereby removing the source/drain bulk leakage, such that the device performance can be improved.

According to some embodiments, a semiconductor device includes a substrate, a gate structure, a plurality of nanowires, a sacrificial material, and an epitaxy structure. The gate structure is disposed on and in contact with the substrate. The nanowires extend through the gate structure. The sacrificial material is separated from the gate structure. The epitaxy structure is in contact with the nanowires, is separated from the substrate, and surrounds the sacrificial material.

According to some embodiments, a semiconductor device includes a substrate, a plurality of nanowires, a gate structure, an epitaxy structure, and a sacrificial material. The nanowires are disposed on the substrate. The gate structure is disposed on the substrate and wraps around the nanowires. The epitaxy structure is separated from the substrate and wraps around at least one of the nanowires. The sacrificial material is embedded in the epitaxy structure.

According to some embodiments, a semiconductor device includes a method for manufacturing a semiconductor device includes forming a bottom sacrificial layer and a multilayer stack on a substrate in which the multilayer stack comprises a plurality of nanowires and at least one sacrificial material arranged in an alternating manner in which the bottom sacrificial layer is formed between the substrate and the multilayer stack; forming at least one gate structure straddling the multilayer stack and the bottom sacrificial layer; forming at least one epitaxial structure on a portion of the multilayer stack exposed by the gate structure in which the epitaxial structure surrounds at least one of the nanowires and the at least one sacrificial material and is formed on the bottom sacrificial layer; removing the bottom sacrificial layer and portions of the sacrificial material uncovered by the gate structure and the epitaxial structures.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   a substrate;
   a gate structure disposed above the substrate;
   a plurality of nanowires extending through the gate structure;
   a sacrificial material separated from the gate structure;
   a gate spacer material disposed on a sidewall of the gate structure; and
   an epitaxy structure in contact with the nanowires and having a portion underlying and vertically overlapped with a bottommost surface of the sacrificial material,
   wherein the gate spacer material is in direct contact with a first sidewall and a second sidewall of the sacrificial material, the first sidewall is opposite to the second sidewall, and a first distance between the first sidewall and the gate structure is shorter than a second distance between the second sidewall and the gate structure,
   wherein a bottom surface of the portion of the epitaxy structure is in contact with the gate spacer material such that the epitaxy structure is isolated from the substrate by the gate spacer material,
   wherein the gate spacer material extends into a space between the epitaxy structure and the substrate.

2. The semiconductor device of claim 1, wherein the bottom surface of the portion of the epitaxy structure is coplanar with a bottom surface of at least one of the nanowires.

3. The semiconductor device of claim 1, wherein the gate spacer material further covers the epitaxy structure.

4. The semiconductor device of claim 1, wherein the gate spacer material is further disposed between adjacent two of the nanowires, and is in contact with a bottom surface of the adjacent two of the nanowires.

5. The semiconductor device of claim 1, wherein the gate spacer material is further disposed between the sacrificial material and the gate structure.

6. The semiconductor device of claim 2, wherein the gate spacer material is in contact with a bottom surface of at least one of the nanowires.

7. The semiconductor device of claim 1, wherein at least one of the nanowires extends through the epitaxy structure.

8. The semiconductor device of claim 1, wherein the substrate has a semiconductor fin disposed directly below the epitaxy structure.

9. The semiconductor device of claim 8, wherein an entirety of a top surface of the semiconductor fin is in contact with the gate spacer material such that the semiconductor fin is isolated from the portion of the epitaxy structure by the gate spacer material.

10. The semiconductor device of claim 8, further comprising an interlayer dielectric at least partially disposed between the epitaxy structure and the semiconductor fin.

11. A semiconductor device, comprising:
    a substrate;
    a plurality of nanowires disposed on the substrate;
    a gate structure disposed on the substrate and wrapping around the nanowires;
    an epitaxy structure separated from the substrate;
    a sacrificial material embedded in the epitaxy structure; and
    a gate spacer material having a first portion vertically sandwiched between the epitaxy structure and the substrate and a second portion extending from the first portion along a direction inclined with the first portion to line a slant facet of the epitaxy structure, wherein the first portion of the gate spacer material is in contact with a bottommost surface of the epitaxy structure and a bottom surface of at least one of the nanowires, wherein an upper width of the first portion of the gate spacer material is greater than a lower width of the first portion of the gate spacer material.

12. The semiconductor device of claim 11, wherein the gate spacer material is in contact with a sidewall of the gate structure.

13. The semiconductor device of claim 11, wherein the substrate has a semiconductor fin disposed under the epitaxy structure, and an entirety of the bottommost surface of the epitaxy structure is in contact with the first portion of the gate spacer material such that the epitaxy structure is isolate from the semiconductor fin of the substrate by the first portion of the gate spacer material.

14. The semiconductor device of claim 11, wherein the gate spacer material separates the sacrificial material and the gate structure.

15. The semiconductor device of claim 11, further comprising an interlayer dielectric covering the gate spacer material.

16. A method for manufacturing a semiconductor device comprising:
    forming a bottom sacrificial layer and a multilayer stack on a substrate, wherein the multilayer stack comprises a plurality of nanowires and at least one sacrificial material arranged in an alternating manner, wherein the bottom sacrificial layer is formed between the substrate and the multilayer stack;
    forming at least one gate structure straddling the multilayer stack and the bottom sacrificial layer;
    forming a dummy gate spacer along sidewalls of the gate structure and the bottom sacrificial layer;

forming at least one epitaxy structure on a portion of the multilayer stack exposed by the gate structure, wherein the epitaxy structure is formed on the bottom sacrificial layer;

after forming the epitaxy structure, removing the dummy gate spacer from the sidewalls of the gate structure and the bottom sacrificial layer;

removing the bottom sacrificial layer directly underlying the epitaxy structure and portions of the sacrificial material uncovered by the gate structure and the epitaxy structure; and forming a gate spacer material on a sidewall of the gate structure, wherein the epitaxy structure has a sidewall that extends substantially along a longitudinal direction of the nanowires, and the gate spacer material has a portion in contact with the sidewall of the epitaxy structure.

17. The method of claim 16, further comprising:

forming a dummy spacer material to cover the multilayer stack and the gate structure;

removing a portion of the dummy spacer material to expose portions of the nanowires and a portion of the sacrificial material, wherein the remaining portion of the dummy spacer material is at least disposed the sidewalls of the gate structure and the bottom sacrificial layer to form the dummy gate spacer; and epitaxially growing the epitaxy structure on the exposed portions of the nanowires and the exposed portion of the sacrificial material.

18. The method of claim 16, wherein the gate spacer material is at least between the epitaxy structure and the substrate.

19. The method of claim 16, further comprising forming an interlayer dielectric on the gate spacer material.

20. The method of claim 16, further comprising:

forming a source/drain contact above the epitaxy structure, wherein the gate spacer material is in contact with the source/drain contact.

* * * * *